United States Patent
Tsukamoto

(10) Patent No.: US 10,152,185 B2
(45) Date of Patent: Dec. 11, 2018

(54) METHOD FOR MANUFACTURING LAMINATE CONTAINING PATTERNED LAYERS TO BE PLATED, METHOD FOR MANUFACTURING METAL LAYER-CONTAINING LAMINATE, TOUCH PANEL SENSOR, TOUCH PANEL, LAMINATE CONTAINING PATTERNED LAYERS TO BE PLATED, AND METAL LAYER-CONTAINING LAMINATE

(71) Applicant: FUJIFILM CORPORATION, Tokyo (JP)

(72) Inventor: Naoki Tsukamoto, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 21 days.

(21) Appl. No.: 15/433,430

(22) Filed: Feb. 15, 2017

(65) Prior Publication Data

US 2017/0160837 A1 Jun. 8, 2017

Related U.S. Application Data

(63) Continuation of application No. PCT/JP2015/074149, filed on Aug. 27, 2015.

(30) Foreign Application Priority Data

Sep. 22, 2014 (JP) ................................ 2014-192739

(51) Int. Cl.
G06F 3/044 (2006.01)
G06F 3/041 (2006.01)
(Continued)

(52) U.S. Cl.
CPC .......... *G06F 3/044* (2013.01); *C23C 18/1608* (2013.01); *C23C 18/1612* (2013.01);
(Continued)

(58) Field of Classification Search
CPC .......... G06F 3/044; G06F 2203/04103; G06F 3/041; C25D 7/00; C23C 18/30;
(Continued)

(56) References Cited

U.S. PATENT DOCUMENTS

2011/0104454 A1 5/2011 Kawano et al.
2011/0289771 A1 12/2011 Kuriki

FOREIGN PATENT DOCUMENTS

JP 2000-098620 A 4/2000
JP 2011-94192 A 5/2011
(Continued)

OTHER PUBLICATIONS

International Search Report issued in PCT/JP2015/074149; dated Dec. 1, 2015.
(Continued)

*Primary Examiner* — Abhishek Sarma
(74) *Attorney, Agent, or Firm* — Studebaker & Brackett PC

(57) ABSTRACT

A method for manufacturing a laminate containing patterned layers to be plated includes a step of preparing a laminate having a substrate having two main surfaces, and layers for forming a layer to be plated, respectively disposed on two main surfaces of the substrate and containing a polymerization initiator, a step of irradiating a layer for forming a layer to be plated in the laminate with light in a patternwise fashion under a predetermined requirement, and a step of removing non-light irradiated regions in the layers for forming a layer to be plated, thereby forming patterned layers to be plated on two main surfaces of the substrate. Also set forth are a touch panel sensor, a touch panel, a laminate containing patterned layers to be plated, and a metal layer-containing laminate.

18 Claims, 5 Drawing Sheets

(51) Int. Cl.

| | | |
|---|---|---|
| *C25D 7/00* | (2006.01) | |
| *C23C 18/16* | (2006.01) | |
| *C23C 18/20* | (2006.01) | |
| *C23C 18/30* | (2006.01) | |
| *G03F 7/038* | (2006.01) | |
| *G03F 7/09* | (2006.01) | |
| *G03F 7/20* | (2006.01) | |
| *G03F 7/40* | (2006.01) | |
| *H05K 3/18* | (2006.01) | |
| *C23C 18/34* | (2006.01) | |
| *C23C 18/40* | (2006.01) | |
| *C23C 18/44* | (2006.01) | |
| *C23C 18/52* | (2006.01) | |
| *H05K 1/02* | (2006.01) | |

(52) U.S. Cl.
CPC .......... *C23C 18/2086* (2013.01); *C23C 18/30* (2013.01); *C25D 7/00* (2013.01); *G03F 7/0388* (2013.01); *G03F 7/091* (2013.01); *G03F 7/2022* (2013.01); *G03F 7/40* (2013.01); *G06F 3/041* (2013.01); *H05K 3/182* (2013.01); *C23C 18/1653* (2013.01); *C23C 18/34* (2013.01); *C23C 18/40* (2013.01); *C23C 18/44* (2013.01); *C23C 18/52* (2013.01); *G06F 2203/04103* (2013.01); *H05K 1/0289* (2013.01)

(58) Field of Classification Search
CPC ............ C23C 18/2086; C23C 18/1612; C23C 18/1608; C23C 18/1653; C23C 18/40; C23C 18/52; C23C 18/44; C23C 18/34; G03F 7/2022; G03F 7/091; G03F 7/0388; G03F 7/40; H05K 3/182; H05K 1/0289
See application file for complete search history.

(56) References Cited

FOREIGN PATENT DOCUMENTS

| | | |
|---|---|---|
| JP | 2012-006377 A | 1/2012 |
| JP | 2012-097296 A | 5/2012 |
| JP | 2014-026085 A | 2/2014 |
| KR | 10-2012-0117762 A | 10/2012 |

OTHER PUBLICATIONS

An Office Action issued by Chinese Patent Office dated Dec. 1, 2017, which corresponds to Chinese Patent Application No. 201580048411.0 and is related to U.S. Appl. No. 15/433,430; with its English translation.
The extended European search report issued by the European Patent Office dated Sep. 4, 2017, which corresponds to European Patent Application No. 15845223.5-1568 and is related to U.S. Appl. No. 15/433,430.
An Office Action; "Notice of Reasons for Refusal," issued by the Korean Intellectual Property Office dated Dec. 1, 2017, which corresponds to Korean Patent Application No. 10-2017-7005480 and is related to U.S. Appl. No. 15/433,430; with English language concise explanation.
An Office Action; "Notice of Reasons for Refusal," issued by the Japanese Patent Office dated Feb. 6, 2018, which corresponds to Japanese Patent Application No. 2016-550056 and is related to U.S. Appl. No. 15/433,430; with English language concise explanation.
Notification of Transmittal of Copies of Translation of the International Preliminary Report on Patentability (Chapter I) and Translation of Written Opinion of the International Searching Authority; PCT/JP2015/074149; dated Apr. 6, 2017.
An Office Action mailed by the Korean Intellectual Property Office dated Jun. 20, 2018, which corresponds to Korean Patent Application No. 10-2017-7005480 and is related to U.S. Appl. No. 15/433,430.
An Office Action mailed by the State Intellectual Property Office of the People's Republic of China dated Jun. 26, 2018, which corresponds to Chinese Patent Application No. 201580048411.0 and is related to U.S. Appl. No. 15/433,430.

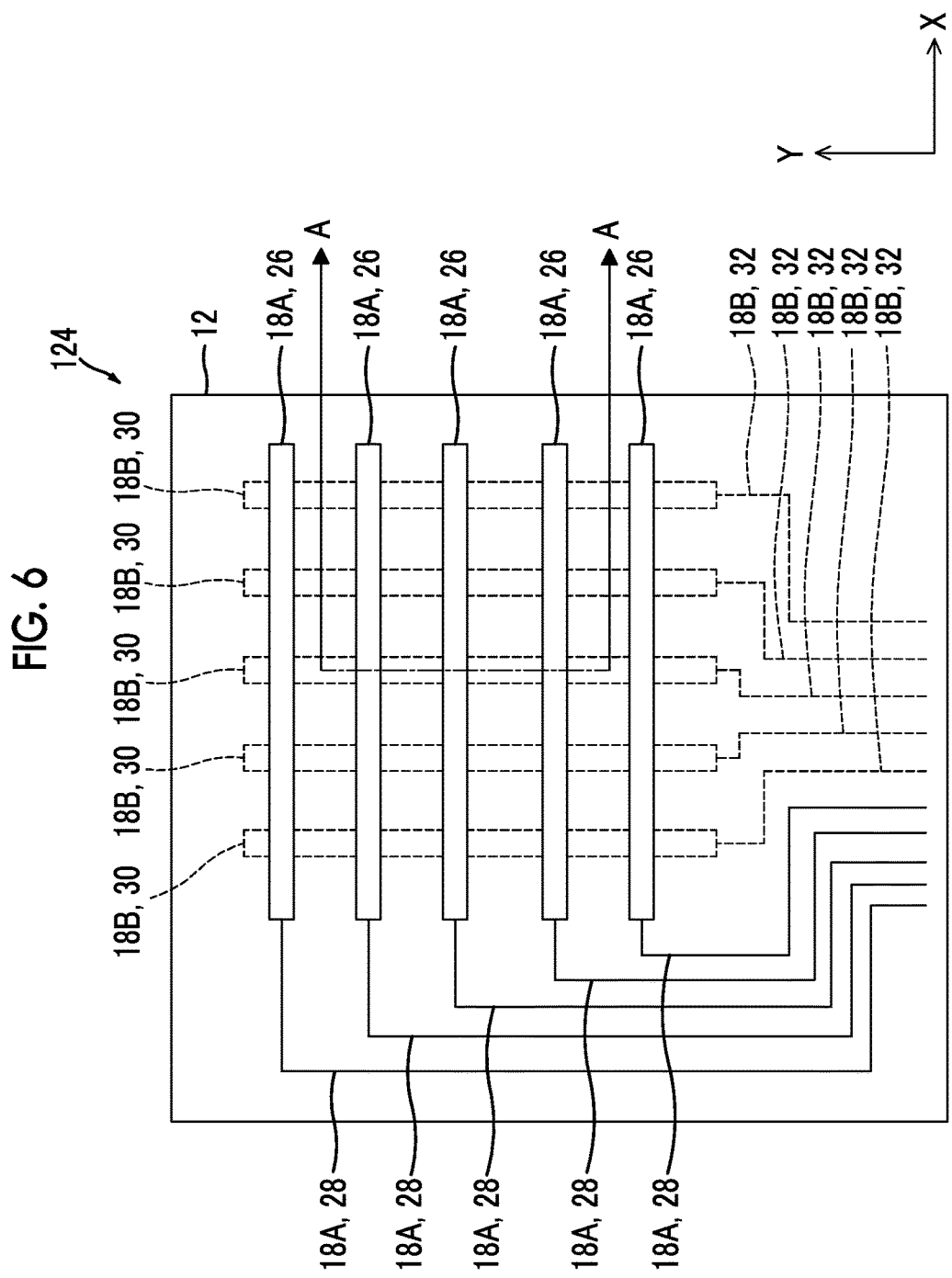

METHOD FOR MANUFACTURING LAMINATE CONTAINING PATTERNED LAYERS TO BE PLATED, METHOD FOR MANUFACTURING METAL LAYER-CONTAINING LAMINATE, TOUCH PANEL SENSOR, TOUCH PANEL, LAMINATE CONTAINING PATTERNED LAYERS TO BE PLATED, AND METAL LAYER-CONTAINING LAMINATE

CROSS-REFERENCE TO RELATED APPLICATIONS

This application is a Continuation of PCT International Application No. PCT/JP2015/074149 filed on Aug. 27, 2015, which claims priority under 35 U.S.C. § 119(a) to Japanese Patent Application No. 2014-192739 filed on Sep. 22, 2014. The above application is hereby expressly incorporated by reference, in its entirety, into the present application.

BACKGROUND OF THE INVENTION

1. Field of the Invention

The present invention relates to a method for manufacturing a laminate containing patterned layers to be plated, a method for manufacturing a metal layer-containing laminate, a touch panel sensor, a touch panel, a laminate containing patterned layers to be plated, and a metal layer-containing laminate.

2. Description of the Related Art

A conductive film having a conductive layer (conductive fine wire) formed on a substrate has been used in various applications. In particular, in recent years, with an increased installation rate of a touch panel into a mobile phone, a portable game instrument or the like, demand of a conductive film for a capacitive touch panel sensor capable of multi-point detection has been rapidly expanding.

A variety of methods have been proposed as a method for manufacturing a conductive layer. For example, JP2012-097296A has proposed a method of forming a conductive layer in which a layer to be plated is formed on the entire surface of a substrate using a resin composition layer (layer for forming a layer to be plated) containing a resin having a functional group capable of interacting with a plating catalyst or a precursor thereof and a polymerizable group, and a polymerization initiator, the plating catalyst or the precursor thereof is applied to carry out a plating treatment, a metal layer is formed on the layer to be plated, and then an unnecessary portion of the metal layer is removed by a photolithography process, thus forming a conductive layer (subtractive method). Further, in the Example section of JP2012-097296A, IRGACURE OXE-02 or the like is used as a polymerization initiator.

SUMMARY OF THE INVENTION

On the other hand, there is a case where a conductive film having conductive layers disposed on both surfaces of a substrate is used as the conductive film for a touch panel sensor.

In a case where it is desired to prepare a conductive film using the method described in JP2012-097296A, there is a method in which the resin composition layer is disposed on one main surface of a substrate, a patternwise exposure is carried out, an unexposed region of the resin composition layer is removed to form a patterned layer to be plated, a plating treatment is carried out to dispose a metal layer on the layer to be plated, and then the same treatment is also carried out on the other main surface of the substrate, whereby metal layers are disposed on both surfaces of the substrate. However, in this method, it is necessary to carry out individual steps for each surface of the substrate, that is, it is necessary to carry out individual steps twice, thus resulting in an increased number of steps, which is not necessarily industrially preferable. Further, due to expansion and contraction of the substrate resulting from the treatment of the one side thereof, the pattern of the other side may deviate from that of the foregoing one side.

In contrast, if it may be carried out in such a manner that the resin composition layers are respectively disposed on both surfaces of a substrate, exposure is carried out in a patternwise fashion from both surfaces of the substrate, the unexposed regions in the resin composition layers are removed to form patterned layers to be plated on both surfaces of the substrate, and then a plating treatment is carried out, it may carry out a removing treatment of unexposed regions in the resin composition layers and a plating treatment only once, and it is therefore possible to reduce the number of steps. Further, there is a low possibility where patterns of both surfaces are deviate from each other.

However, the present inventors have found that when the resin composition layer containing IRGACURE OXE-02, which is specifically disclosed in JP2012-097296A, is disposed on both surfaces of a substrate, and then a patternwise light irradiation is carried out from both surfaces, there is a problem that the light irradiated from one surface side of the substrate reaches to the other surface side, and therefore the resin composition layer disposed on the other surface side of the substrate is also exposed to light.

In view of the above circumstances, an object of the present invention is to provide a method which is capable of more conveniently manufacturing a laminate containing patterned layers to be plated, which has patterned layers to be plated disposed on both surfaces of a substrate.

Further, another object of the present invention is also to provide a method for manufacturing a metal layer-containing laminate, a touch panel sensor, a touch panel, a laminate containing patterned layers to be plated, and a metal layer-containing laminate.

The present inventors have conducted extensive studies on the problems of the related art and have found that the foregoing problems can be solved by controlling light absorption properties of a polymerization initiator and a substrate, and the wavelength of light to be irradiated.

That is, the present inventors have found that the foregoing problems can be solved by the following configuration.

(1) A method for manufacturing a laminate containing patterned layers to be plated, comprising:

a step A of preparing a laminate having a substrate having two main surfaces, and layers for forming a layer to be plated, respectively disposed on two main surfaces of the substrate and containing a polymerization initiator and the following compound X or composition Y;

a step B including a step B-1 of irradiating one layer for forming a layer to be plated with light in a patternwise fashion from one main surface side of the substrate in the laminate, so as to satisfy the following requirement 1 or requirement 2, and a step B-2 of irradiating the other layer for forming a layer to be plated with light in a patternwise fashion from the other main surface of the substrate, so as to satisfy the following requirement 1 or requirement 2; and a step C of removing non-light irradiated regions in the layers for forming a layer to be plated to form patterned layers to be plated on two main surfaces of the substrate, respectively, Compound X: a compound having a functional group capable of interacting with a plating catalyst or a precursor thereof, and a polymerizable group, Composition Y: a composition containing a compound having a functional group capable of interacting with a plating catalyst or a precursor thereof, and a compound having a polymerizable group, Requirement 1: in a case where an absorption edge on the long wavelength side of an ultraviolet-visible absorption spectrum of the polymerization initiator is present in the shorter wavelength side than the absorption edge on the long wavelength side of the ultraviolet-visible absorption spectrum of the substrate, the layer for forming a layer to be plated is irradiated in a patternwise fashion with light of a wavelength to which the polymerization initiator is exposed, and Requirement 2: in a case where the absorption edge on the long wavelength side of the ultraviolet-visible absorption spectrum of the polymerization initiator is present in the longer wavelength side than the absorption edge on the long wavelength side of the ultraviolet-visible absorption spectrum of the substrate, the layer for forming a layer to be plated is irradiated in a patternwise fashion with light of a wavelength to which the polymerization initiator is exposed, as light excluding light of a wavelength longer than or equal to a wavelength of the absorption edge on the long wavelength side of the ultraviolet-visible absorption spectrum of the substrate and shorter than or equal to a wavelength of the absorption edge on the long wavelength side of the ultraviolet-visible absorption spectrum of the polymerization initiator.

(2) The method for manufacturing a laminate containing patterned layers to be plated according to (1), in which, in the requirement 2, light irradiation is carried out using a light-blocking filter at least blocking the light having a wavelength longer than or equal to a wavelength of the absorption edge on the long wavelength side of the ultraviolet-visible absorption spectrum of the substrate and shorter than or equal to a wavelength of the absorption edge on the long wavelength side of the ultraviolet-visible absorption spectrum of the polymerization initiator.

(3) The method for manufacturing a laminate containing patterned layers to be plated according to (1) or (2), in which the substrate is a resin substrate.

(4) The method for manufacturing a laminate containing patterned layers to be plated according to any one of (1) to (3), in which an ultraviolet absorber is included in the substrate.

(5) The method for manufacturing a laminate containing patterned layers to be plated according to any one of (1) to (4), in which the substrate is a laminate having a support and an ultraviolet absorbing layer containing an ultraviolet absorber disposed on the support.

(6) A method for manufacturing a metal layer-containing laminate, comprising a step of applying a plating catalyst or a precursor thereof onto the patterned layer to be plated in the laminate containing patterned layers to be plated obtained from the manufacturing method according to any one of (1) to (5), carrying out a plating treatment on the patterned layer to be plated onto which the plating catalyst or the precursor thereof was applied, and then forming a metal layer on the patterned layer to be plated.

(7) A touch panel sensor comprising a metal layer-containing laminate obtained from the manufacturing method according to (6).

(8) A touch panel comprising a metal layer-containing laminate obtained from the manufacturing method according to (6).

(9) A laminate containing patterned layers to be plated, comprising:

a substrate having two main surfaces; and patterned layers to be plated, respectively disposed on two main surfaces of the substrate and used for a plating catalyst or a precursor thereof to be supported, in which patterns of the patterned layers to be plated respectively disposed on two main surfaces of the substrate are different.

(10) A metal layer-containing laminate, comprising:

the laminate containing patterned layers to be plated according to (9); and a metal layer disposed on a surface other than the contact surface with the substrate of the patterned layer to be plated in the laminate containing patterned layers to be plated.

According to the present invention, it is possible to provide a method which is capable of more conveniently manufacturing a laminate containing patterned layers to be plated, which have patterned layers to be plated disposed on both surfaces of a substrate.

Further, according to the present invention, it is also possible to provide a method for manufacturing a metal layer-containing laminate, a touch panel sensor, a touch panel, a laminate containing patterned layers to be plated, and a metal layer-containing laminate.

BRIEF DESCRIPTION OF THE DRAWINGS

FIG. 6 is a plan view showing an embodiment of the metal layer-containing laminate.

DESCRIPTION OF THE PREFERRED EMBODIMENTS

Hereinafter, a method for manufacturing a laminate containing patterned layers to be plated according to the present invention will be described in detail.

The numerical value ranges shown with "to" in the present specification means ranges including the numerical values indicated before and after "to" as the lower limit and the upper limit, respectively. Further, the drawings according to the invention are schematic views and the thickness relations and the positional relations between the respective layers do not necessarily coincide with actual ones.

One of the characteristic points of the method for manufacturing a laminate containing patterned layers to be plated according to the present invention may be the fact that light absorption properties of a polymerization initiator and a substrate, and a wavelength of the irradiating light are controlled.

Hereinafter, first, problems of the related art will be described in detail.

Figure 1:
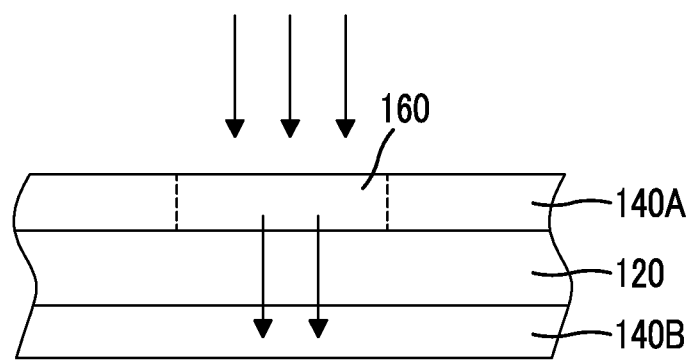
FIG. 1 is a conceptual diagram showing the problems of the related art.

In JP2012-097296A, a resin composition layer containing IRGACURE OXE-02 has been used, and irradiation with a UV (ultraviolet) exposure machine (wavelength: 365 nm) has been disclosed. As shown in FIG. 1, when the resin composition layers 140A and 140B are disposed on both surfaces of a substrate 120, and light irradiation is carried out in a patternwise fashion by the UV exposure machine from the one surface side of the substrate, a predetermined region of the resin composition layer 140A is exposed to light. On the other hand, a portion of light irradiated to the irradiation region 160 of the resin composition layer 140A transmits through the substrate 120 and reaches to the resin composition layer 140B, so there is a problem that the region of the resin composition layer 140B not desired to be exposed is also exposed to light.

Hereinafter, the present invention in which the above-described problem has been solved will be described in detail.

Figure 2:
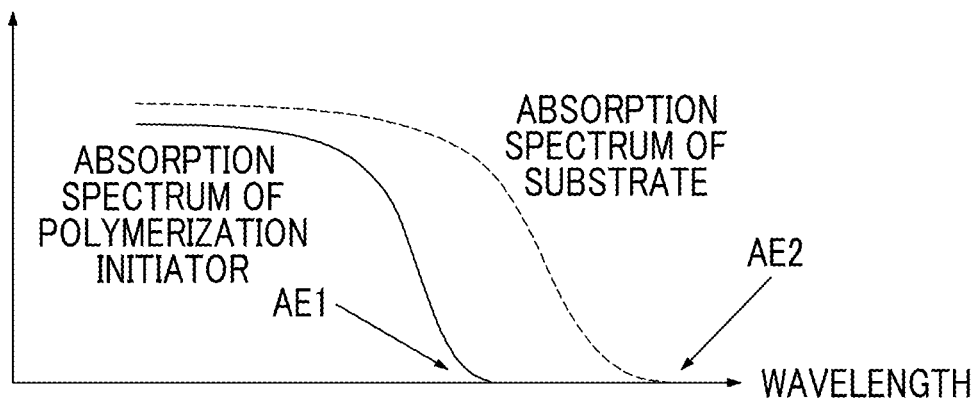
FIG. 2 is a diagram showing a relationship between ultraviolet-visible absorption spectra of a polymerization initiator and a substrate in a first embodiment of a method for manufacturing a laminate containing patterned layers to be plated according to the present invention.
Figure 3:
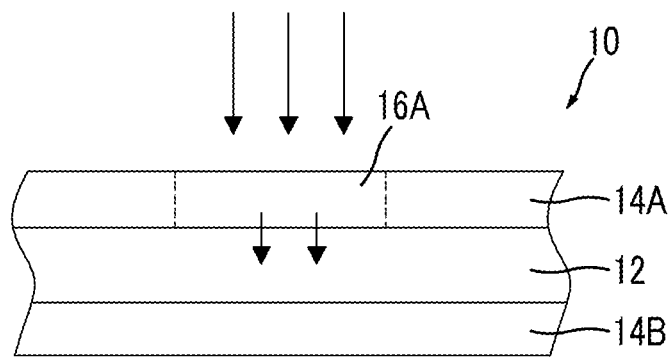
FIG. 3 is a conceptual diagram showing a mechanism of the method for manufacturing a laminate containing patterned layers to be plated according to the present invention.

First, in a first embodiment of the method for manufacturing a laminate containing patterned layers to be plated according to the present invention, the absorption edge on the long wavelength side of the ultraviolet-visible absorption spectrum of the polymerization initiator is positioned on the shorter wavelength side than the absorption edge on the long wavelength side of the ultraviolet-visible absorption spectrum of the substrate. The relationship between ultraviolet-visible absorption spectra of the polymerization initiator and the substrate is shown in FIG. 2. As shown in FIG. 2, in the first embodiment, the absorption edge AE1 on the long wavelength side of the ultraviolet-visible absorption spectrum of the polymerization initiator is positioned on the shorter wavelength side than the absorption edge AE2 on the long wavelength side of the ultraviolet-visible absorption spectrum of the substrate. In this embodiment, the absorption wavelength range of the polymerization initiator overlaps the absorption wavelength range of the substrate. Thus, in such an embodiment, as shown in FIG. 3, when layers for forming a layer to be plated (a first layer 14A for forming a layer to be plated and a second layer 14B for forming a layer to be plated) disposed on both surfaces of the substrate 12 are irradiated with light of a wavelength to which the polymerization initiator is exposed (that is, light having a wavelength of the shorter wavelength side than the absorption edge AE2 of the substrate and also having a wavelength to which the polymerization initiator is exposed, in other words, light having a wavelength of the shorter wavelength side than the absorption edge AE1 of the polymerization initiator), the light transmitted through the irradiation region 16A of the first layer 14A for forming a layer to be plated is absorbed by the substrate 12, and therefore such light can be suppressed from reaching to the second layer 14B for forming a layer to be plated.

Figure 4:
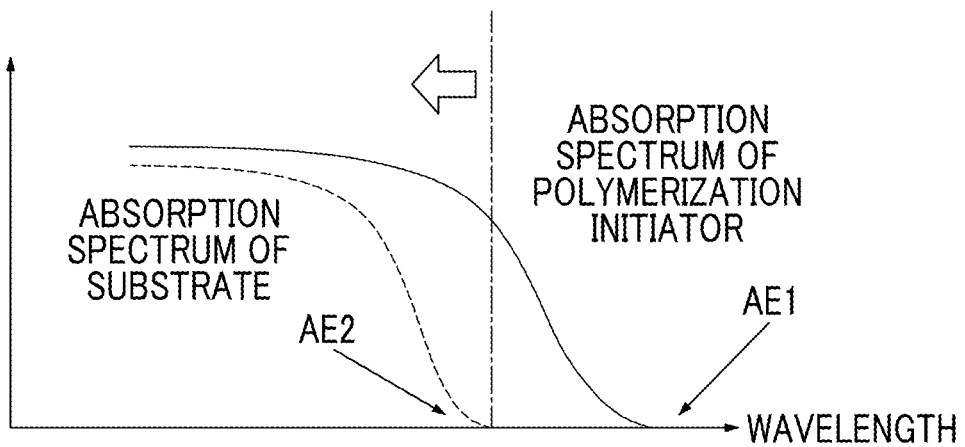
FIG. 4 is a diagram showing a relationship between ultraviolet-visible absorption spectra of a polymerization initiator and a substrate in a second embodiment of the method for manufacturing a laminate containing patterned layers to be plated according to the present invention.

Further, in a second embodiment of the method for manufacturing a laminate containing patterned layers to be plated according to the present invention, the absorption edge on the long wavelength side of the ultraviolet-visible absorption spectrum of the polymerization initiator is positioned on the longer wavelength side than the absorption edge on the long wavelength side of the ultraviolet-visible absorption spectrum of the substrate. In the second embodiment, the relationship between ultraviolet-visible absorption spectra of the polymerization initiator and the substrate is shown in FIG. 4. As shown in FIG. 4, in the second embodiment, the absorption edge AE1 on the long wavelength side of the ultraviolet-visible absorption spectrum of the polymerization initiator is positioned on the longer wavelength side than the absorption edge AE2 on the long wavelength side of the ultraviolet-visible absorption spectrum of the substrate. In such an embodiment, as indicated by white arrow in FIG. 4, by irradiating light having a wavelength of the shorter wavelength side than the absorption edge AE2 of the substrate (that is, light having a wavelength of the shorter wavelength side than the absorption edge AE2 of the substrate and also having a wavelength to which the polymerization initiator is exposed. In other words, light of a wavelength to which the polymerization initiator is exposed, as light excluding (not including) light having a wavelength longer than or equal to a wavelength of the absorption edge on the long wavelength side of the ultraviolet-visible absorption spectrum of the substrate and shorter than or equal to a wavelength of the absorption edge on the long wavelength side of the ultraviolet-visible absorption spectrum of the polymerization initiator), as in the first embodiment, the light that has transmitted through the irradiation region 16A of the first layer 14A for forming a layer to be plated is absorbed by the substrate 12, and therefore such light can be suppressed from reaching to the second layer 14B for forming a layer to be plated.

<<First Embodiment>>

The first embodiment of the method for manufacturing a laminate containing patterned layers to be plated according to the present invention includes a step A of preparing a laminate having a substrate having two main surfaces and layers for forming a layer to be plated respectively disposed on two main surfaces of the substrate (a laminate preparing step), a step B of irradiating light in a patternwise fashion onto the layers for forming a layer to be plated (an irradiating step), and a step C of removing the non-irradiated regions in the layers for forming a layer to be plated to form patterned layers to be plated on both surfaces of the substrate (a step of forming a layer to be plated).

Further, in the first embodiment, the absorption edge on the long wavelength side of the ultraviolet-visible absorption spectrum of the polymerization initiator is present in the shorter wavelength side than the absorption edge on the long wavelength side of the ultraviolet-visible absorption spectrum of the substrate. This relationship corresponds to the relationship described above with reference to FIG. 2.

FIGS. 5A to 5F are step-by-step sectional views showing the first embodiment of the method for manufacturing a laminate containing patterned layers to be plated and a metal layer-containing laminate according to the present invention. Hereinafter, materials and procedures used in the respective steps will be described in detail with reference to the drawings.

<Laminate Preparing Step>

Figure 5A:
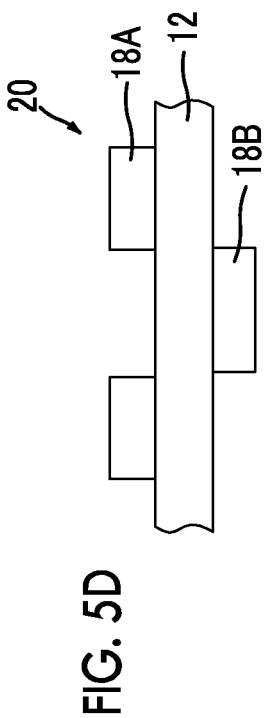
FIGS. 5A to 5F are step-by-step sectional views showing the first embodiment of the method for manufacturing a laminate containing patterned layers to be plated and a metal layer-containing laminate according to the present invention.

This step is a step of preparing a laminate having a substrate having two main surfaces and layers for forming a layer to be plated respectively disposed on two main surfaces of the substrate. More specifically, as shown in FIG. 5A, in this step, a laminate 10 having a substrate 12 and a first layer 14A for forming a layer to be plated and a second layer 14B for forming a layer to be plated disposed on two main surfaces of the substrate 12 is prepared. The laminate obtained in this step corresponds to a precursor having a layer for forming a layer to be plated on which light irradiation to be described hereinafter is carried out.

Hereinafter, first, individual members and individual materials contained in the laminate will be described in detail, and then steps of the procedure will be described in detail.

[Substrate]

The substrate is not particularly limited as long as it has two main surfaces and satisfies a predetermined relationship with the absorption edge on the long wavelength side of the ultraviolet-visible absorption spectrum of the polymerization initiator to be described hereinafter. The substrate may be, for example, an insulating substrate. More specifically, a resin substrate, a ceramic substrate, a glass substrate, or the like may be used. Preferred is a resin substrate. Further, the resin substrate also includes a pressure sensitive adhesive sheet to be described hereinafter.

Examples of the material for the resin substrate include a polyester-based resin (polyethylene terephthalate or polyethylene naphthalate), polyethersulfone, a polyacrylic resin, a polyurethane-based resin, a polycarbonate-based resin, a polysulfone-based resin, a polyamide-based resin, a polyarylate-based resin, a polyolefin-based resin, a cellulose-based resin, a polyvinyl chloride-based resin, and a cycloolefin-based resin. Among them, preferred is polyethylene terephthalate, polyethylene naphthalate, or polyolefin.

Further, a pressure sensitive adhesive substrate, that is, a pressure sensitive adhesive sheet may be used as the substrate. Known materials (an acrylic-based pressure sensitive adhesive, a silicone-based pressure sensitive adhesive, and the like) may be used as the material constituting the pressure sensitive sheet.

The thickness of the substrate (mm) is not particularly limited. From the viewpoint of the balance of handleability and being made into a thin thickness, the thickness of the resin substrate is preferably 0.01 to 2 mm, more preferably 0.02 to 1 mm, and most preferably 0.03 to 0.1 mm. Further, the thickness of the glass substrate is preferably 0.01 to 2 mm, more preferably 0.3 to 0.8 mm, and most preferably 0.4 to 0.7 mm Further, the substrate is preferably a substrate which is properly light-transmissive. Specifically, the total light transmittance of the substrate is preferably 85% to 100%.

The position of the absorption edge on the long wavelength side of the ultraviolet-visible absorption spectrum of the substrate is not particularly limited, but it is preferably 400 nm or less, more preferably 380 nm or less, and still more preferably 320 nm or less, from the viewpoint of excellent transparency and visibility of a laminate containing patterned layers to be plated which will be formed. The lower limit is not particularly limited, but it is 250 nm or more in many cases from the viewpoint of material properties.

The position of the absorption edge of the ultraviolet-visible absorption spectrum of the substrate typically depends on the material of the substrate.

Further, the absorption edge on the long wavelength side of the ultraviolet-visible absorption spectrum of the substrate refers to a wavelength of the longest wavelength side at which the absorbance becomes 1.0 or less when the ultraviolet-visible absorption spectrum of the substrate is measured by UV-3000 (Shimadzu Corporation).

The substrate may contain an ultraviolet absorber. By the incorporation of the ultraviolet absorber into the substrate, the absorption edge of the ultraviolet-visible absorption spectrum of the substrate is shifted to the longer wavelength side and is therefore likely to position on longer wavelength side than the absorption edge of the ultraviolet-visible absorption spectrum of a polymerization initiator to be described hereinafter.

Further, as the ultraviolet absorber, it is preferred to select an ultraviolet absorber having an absorption edge on the longer wavelength side than the absorption edge on the long wavelength side of the ultraviolet-visible absorption spectrum of a polymerization initiator to be described hereinafter. That is, the absorption edge on the long wavelength side of the ultraviolet-visible absorption spectrum of the ultraviolet absorber to be used is preferably on the longer wavelength side than the absorption edge on the long wavelength side of the ultraviolet-visible absorption spectrum of the polymerization initiator.

Further, the method of measuring the absorption edge of the ultraviolet-visible absorption spectrum of the substrate in a case of using an ultraviolet absorber may also be similar to the above-mentioned procedure.

The type of the ultraviolet absorber to be used is not particularly limited. Known ultraviolet absorbers may be used, and examples thereof include a salicylic acid-based ultraviolet absorber, a benzophenone-based ultraviolet absorber, a benzotriazole-based ultraviolet absorber, a cyanoacrylate-based ultraviolet absorber, a benzoate-based ultraviolet absorber, a malonate-based ultraviolet absorber, and an oxalic acid anilide-based ultraviolet absorber.

Examples of the salicylic acid-based ultraviolet absorber include phenyl salicylate, p-tert-butylphenyl salicylate, and p-octylphenyl salicylate.

Examples of the benzophenone-based ultraviolet absorber include 2,4-dihydroxybenzophenone, 2-hydroxy-4-methoxybenzophenone, 2-hydroxy-4-octoxybenzophenone, 2-hydroxy-4-dodecyloxybenzophenone, 2,2'-dihydroxy-4-methoxybenzophenone, 2,2'-dihydroxy-4,4'-dimethoxybenzophenone, 2-hydroxy-4-methoxy-5-sulfobenzophenone, and bis(2-methoxy-4-hydroxy-5-benzoylphenyl)methane.

Examples of the benzotriazole-based ultraviolet absorber include 2-(2H-benzotriazol-2-yl)-4-(1,1,3,3-tetramethylbutyl)phenol, 2-(2'-hydroxy-5'-methylphenyl)benzotriazole, 2-(2'-hydroxy-5'-tert-butylphenyl)benzotriazole, 2-(2'-hydroxy-3',5'-di-tert-butylphenyl)benzotriazole, 2-(2'-hydroxy-3'-tert-butyl-5'-methylphenyl)-5-chlorobenzotriazole, 2-(2'-hydroxy-3',5'-di-tert-butyl-phenyl)-5-chloro-benzotriazole, 2-(2'-hydroxy-3',5'-di-tert-butyl-5'-amylphenyl)benzotriazole, and 2-(2'-hydroxy-4'-octoxyphenyl)benzotriazole.

Examples of the cyanoacrylate-based ultraviolet absorber include 2-ethylhexyl-2-cyano-3,3'-diphenyl acrylate, and ethyl-2-cyano-3,3'-diphenyl acrylate.

The substrate may be a single layer structure or a multilayer structure.

In a case where the substrate is a multilayer structure, the substrate may be, for example, a laminate having a support and an ultraviolet absorbing layer containing an ultraviolet absorber disposed on the support.

The support may or may not contain an ultraviolet absorber. Examples of the type of the support include those exemplified as the substrate described above.

The ultraviolet absorbing layer contains at least an ultraviolet absorber. Examples of the ultraviolet absorber include those described above. Further, the ultraviolet absorber may contain a binder such as a resin.

[Layer for Forming Layer to be Plated]

The layer for forming a layer to be plated is a layer which becomes a layer to be plated by light irradiation to be described hereinafter, and contains at least a polymerization initiator and the following compound X or composition Y. More specifically, the layer for forming a layer to be plated may be a layer containing a polymerization initiator and compound X, or a layer containing a polymerization initiator and composition Y.

Compound X: a compound having a functional group capable of interacting with a plating catalyst or a precursor thereof (hereinafter, simply referred to also as an "interactive group"), and a polymerizable group.

Composition Y: a composition containing a compound having a functional group capable of interacting with a plating catalyst or a precursor thereof, and a compound having a polymerizable group.

Hereinafter, first, materials contained in the layer for forming a layer to be plated will be described in detail.

(Polymerization Initiator)

There is no particular limitation on the polymerization initiator. It may be sufficient if the polymerization initiator satisfies the predetermined relationship with the absorption edge on the long wavelength side of the ultraviolet-visible absorption spectrum of the above-described substrate, and a known polymerization initiator (so-called photopolymerization initiator) or the like may be used. Examples of the polymerization initiator include benzophenones, acetophenones, α-aminoalkylphenones, benzoins, ketones, thioxanthones, benzyls, benzyl ketals, oxime esters, anthrones, tetramethylthiuram monosulfides, bisacyl phosphine oxides, acyl phosphine oxides, anthraquinones, azo compounds or the like, and derivatives thereof.

The absorption edge of the ultraviolet-visible absorption spectrum of the polymerization initiator is intended to refer to a wavelength of the longest wavelength side at which an absorbance becomes 1.0 or less when a solution having a polymerization initiator concentration of 0.01 mass % (using a solvent in which a polymerization initiator is dissolved, for example, acetonitrile, as a solvent) is prepared and the absorbance is measured by UV-3000.

In the first embodiment, it may be sufficient if the absorption edge on the long wavelength side of the ultraviolet-visible absorption spectrum of the polymerization initiator is positioned on the shorter wavelength side than the absorption edge on the long wavelength side of the ultraviolet-visible absorption spectrum of the substrate, and a wavelength difference therebetween (wavelength (nm) of absorption edge on the long wavelength side of the ultraviolet-visible absorption spectrum of the substrate - wavelength (nm) of absorption edge on the long wavelength side of the ultraviolet-visible absorption spectrum of the polymerization initiator) is preferably 5 nm or more and more preferably 10 nm or more, from the viewpoint of easy absorption of light by the substrate. The upper limit is not particularly limited, but it is about 150 nm in many cases.

The content of the polymerization initiator in the layer for forming a layer to be plated is not particularly limited, but it is preferably 0.01 to 5 mass % and more preferably 0.1 to 3 mass % with respect to the total mass of the layer for forming a layer to be plated, from the viewpoint of curability of a layer to be plated.

(Compound X)

The compound X is a compound having an interactive group and a polymerizable group.

The interactive group is intended to refer to a functional group capable of interacting a plating catalyst or a precursor thereof which is applied to a patterned layer to be plated. For example, a functional group capable of forming an electrostatic interaction with a plating catalyst or a precursor thereof, or a nitrogen-, sulfur- or oxygen-containing functional group capable of coordinating with a plating catalyst or a precursor thereof may be used.

More specific examples of the interactive group include nitrogen-containing functional groups such as an amino group, an amide group, an imido group, a urea group, a tertiary amino group, an ammonium group, an amidino group, a triazine ring, a triazole ring, a benzotriazole group, an imidazole group, a benzimidazole group, a quinoline group, a pyridine group, a pyrimidine group, a pyrazine group, a quinazoline group, a quinoxaline group, a purine group, a triazine group, a piperidine group, a piperazine group, a pyrrolidine group, a pyrazole group, an aniline group, an alkylamine structure-containing group, an isocyanuric structure-containing group, a nitro group, a nitroso group, an azo group, a diazo group, an azide group, a cyano group, and a cyanate group; oxygen-containing functional groups such as an ether group, a hydroxyl group, a phenolic hydroxyl group, a carboxylic acid group, a carbonate group, a carbonyl group, an ester group, an N-oxide structure-containing group, an S-oxide structure-containing group, and an N-hydroxy structure-containing group; sulfur-containing functional groups such as a thiophene group, a thiol group, a thiourea group, a thiocyanurate group, a benzothiazole group, a mercaptotriazine group, a thioether group, a thioxy group, a sulfoxide group, a sulfone group, a sulfite group, a sulfoximine structure-containing group, a sulfoxonium salt structure-containing group, a sulfonate group, and a sulfonic ester structure-containing group; phosphorus-containing functional groups such as a phosphato group, a phosphoroamide group, a phosphine group, and a phosphoric ester structure-containing group; and groups containing halogen atoms such as chlorine and bromine. In a functional group that may have a salt structure, a salt thereof may also be used.

Among them, particularly preferred is an ionic polar group such as a carboxylic acid group, a sulfonate group, a phosphato group or a boronate group, an ether group, or a cyano group, and still more preferred is a carboxylic acid group (carboxyl group) or a cyano group, from the viewpoint of high polarity and high adsorptivity to a plating catalyst or a precursor thereof.

The compound X may contain two or more types of interactive groups.

The polymerizable group is a functional group capable of forming a chemical bond via the application of energy, and examples thereof include a radically polymerizable group and a cationic polymerizable group. Among them, a radically polymerizable group is preferable from the viewpoint of superior reactivity. Examples of the radically polymerizable group include unsaturated carboxylic ester groups such as an acrylic ester group (acryloyloxy group), methacrylic ester group (methacryloyloxy group), an itaconic ester group, a crotonic ester group, an isocrotonic ester group, and a maleic ester group; a styryl group, a vinyl group, an acrylamide group, and an methacrylamide group. Among them, preferred is a methacryloyloxy group, an acryloyloxy group, a vinyl group, a styryl group, an acrylamide group, or methacrylamide group and more preferred is a methacryloyloxy group, an acryloyloxy group, or a styryl group.

The compound X may contain two or more polymerizable groups. The number of the polymerizable groups contained in the compound X is not particularly limited and may be one or two or more.

The compound X may be a low molecular weight compound or a polymer compound. The low molecular weight compound is intended to refer to a compound having a molecular weight of less than 1,000, and the polymer compound is intended to refer to a compound having a molecular weight of 1,000 or more.

Further, the low molecular weight compound having a polymerizable group corresponds to a so-called monomer. Further, the polymer compound may be a polymer having a predetermined repeating unit.

Further, the compounds may be used alone or in combination of two or more thereof.

In a case where the compound X is a polymer, the weight-average molecular weight of the polymer is not particularly limited and is preferably 1,000 or more and 700,000 or less and more preferably 2,000 or more and 200,000 or less, from the viewpoint of superior handleability such as solubility. In particular, the weight-average molecular weight is preferably 20,000 or more from the viewpoint of polymerization sensitivity.

The method of synthesizing such a polymer having a polymerizable group and an interactive group is not particularly limited and a known synthesis method (see paragraphs [0097] to [0125] of JP2009-280905A) is used.

(Preferred Aspect 1 of polymer)

A first preferred aspect of the polymer may be, for example, a copolymer containing a polymerizable group-containing repeating unit represented by the following Formula (a) (hereinafter, also referred to as a "polymerizable group unit" where appropriate) and an interactive group-containing repeating unit represented by the following Formula (b) (hereinafter, also referred to as an "interactive group unit" where appropriate).

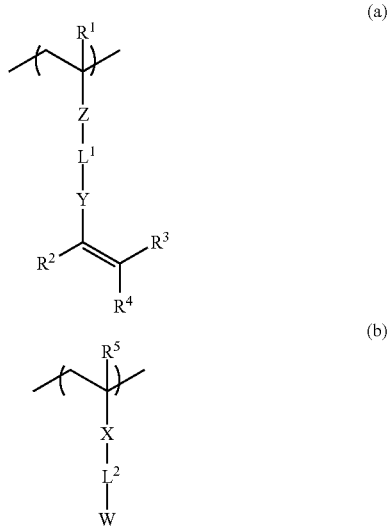

In Formula (a) and Formula (b), $R^1$ to $R^5$ each independently represent a hydrogen atom, or a substituted or unsubstituted alkyl group (for example, a methyl group, an ethyl group, a propyl group, or a butyl group). Further, the type of the substituent is not particularly limited, and examples thereof include a methoxy group, a chlorine atom, a bromine atom, and a fluorine atom.

$R^1$ is preferably a hydrogen atom, a methyl group, or a methyl group substituted with a bromine atom. $R^2$ is preferably a hydrogen atom, a methyl group, or a methyl group substituted with a bromine atom. $R^3$ is preferably a hydrogen atom. $R^4$ is preferably a hydrogen atom. $R^5$ is preferably a hydrogen atom, a methyl group, or a methyl group substituted with a bromine atom.

In Formula (a) and Formula (b), X, Y, and Z each independently represent a single bond, or a substituted or unsubstituted divalent organic group. Examples of the divalent organic group include a substituted or unsubstituted divalent aliphatic hydrocarbon group (which preferably contains 1 to 8 carbon atoms. For example, an alkylene group such as a methylene group, an ethylene group, or a propylene group), a substituted or unsubstituted divalent aromatic hydrocarbon group (which preferably contains 6 to 12 carbon atoms. For example, a phenylene group), —O—, —S—, —SO$_2$—, —N(R)— (R: alkyl group), —CO—, —NH—, —COO—, —CONH—, and a group formed by combining these groups (for example, an alkyleneoxy group, an alkyleneoxycarbonyl group, or an alkylenecarbonyloxy group).

X, Y, and Z are each preferably a single bond, an ester group (—COO—), an amide group (—CONH—), an ether group (—O—), or a substituted or unsubstituted divalent aromatic hydrocarbon group and more preferably a single bond, an ester group (—COO—), or an amide group (—CONH—), from the viewpoint of easy polymer synthesis and superior adhesiveness of a metal layer.

In Formula (a) and Formula (b), $L^1$ and $L^2$ each independently represent a single bond, or a substituted or unsubstituted divalent organic group. The divalent organic group has the same definition as in the divalent organic group described for X, Y, and Z above.

$L^1$ is preferably an aliphatic hydrocarbon group or a divalent organic group (for example, an aliphatic hydrocarbon group) having a urethane bond or a urea bond from the viewpoint of easy polymer synthesis and superior adhesiveness of a metal layer. Among them, preferred are groups having a total number of 1 to 9 carbon atoms. The total number of carbon atoms in $L^1$ refers to the total number of carbon atoms contained in the substituted or unsubstituted divalent organic group represented by $L^1$.

Further, $L^2$ is preferably a single bond, a divalent aliphatic hydrocarbon group, a divalent aromatic hydrocarbon group, or a group formed by combining these groups, from the viewpoint of superior adhesiveness of a metal layer. Among them, $L^2$ is preferably a single bond or has a total number of 1 to 15 carbon atoms, and is particularly preferably unsubstituted. The total number of carbon atoms in $L^2$ refers to the number of total carbon atoms contained in the substituted or unsubstituted divalent organic group represented by $L^2$.

In Formula (b), W represents an interactive group. The definition of the interactive group is as described above.

The content of the polymerizable group unit is preferably 5 to 50 mol % and more preferably 5 to 40 mol % with respect to the total repeating units in the polymer, from the viewpoint of reactivity (curability and polymerizability) and inhibition of gelation during synthesis.

Further, the content of the interactive group unit is preferably 5 to 95 mol % and more preferably 10 to 95 mol % with respect to the total repeating units in the polymer, from the viewpoint of adsorptivity to a plating catalyst or a precursor thereof.

(Preferred Aspect 2 of Polymer)

The second preferred aspect of the polymer may be, for example, a copolymer containing repeating units represented by the following Formula (A), Formula (B), and Formula (C).

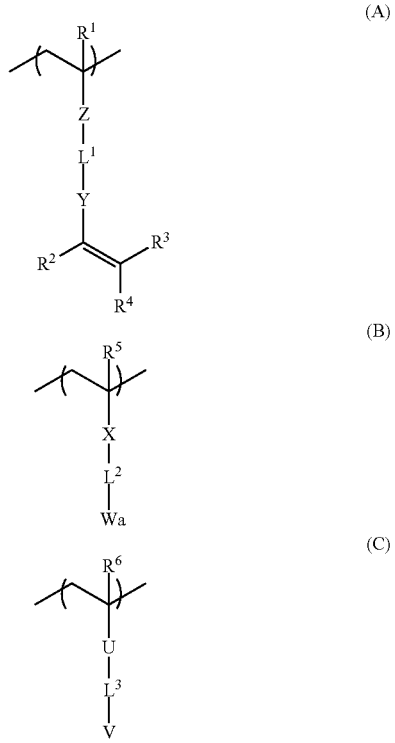

The repeating unit represented by Formula (A) is the same as the repeating unit represented by Formula (a), and the same also applies to the description of each group.

$R^5$, X and $L^2$ in the repeating unit represented by Formula (B) is the same as $R^5$, X and $L^2$ in the repeating unit represented by Formula (b), and the same also applies to the description of each group.

Wa in Formula (B) represents a group capable of interacting with a plating catalyst or a precursor thereof, excluding a hydrophilic group or a precursor group thereof represented by V to be described hereinafter. Among them, preferred is a cyano group or an ether group.

In Formula (C), $R^6$ represents a hydrogen atom or a substituted or unsubstituted alkyl group.

In Formula (C), U represents a single bond or a substituted or unsubstituted divalent organic group. The definition of the divalent organic group is the same as that of the above-described divalent organic group represented by X, Y and Z. U is preferably a single bond, an ester group (—COO—), an amide group (—CONH—), an ether group (—O—), or a substituted or unsubstituted divalent aromatic hydrocarbon group, from the viewpoint of easy polymer synthesis and superior adhesiveness of a metal layer.

In Formula (C), $L^3$ represents a single bond or a substituted or unsubstituted divalent organic group. The definition of the divalent organic group is the same as that of the above-described divalent organic group represented by $L^1$ and $L^2$. $L^3$ is preferably a single bond, or a divalent aliphatic hydrocarbon group, a divalent aromatic hydrocarbon group, or a group formed by combining these groups, from the viewpoint of easy polymer synthesis and superior adhesiveness of a metal layer.

In Formula (C), V represents a hydrophilic group or a precursor group thereof. The hydrophilic group is not particularly limited as long as it is a group exhibiting hydrophilicity, and examples thereof include a hydroxyl group and a carboxylic acid group. The precursor group of the hydrophilic group refers to a group capable of generating a hydrophilic group by a predetermined treatment (for example, treatment with an acid or alkali), and examples thereof include a carboxyl group protected with a 2-tetrahydropyranyl (THP) group.

The hydrophilic group is preferably an ionic polar group from the viewpoint of interaction with a plating catalyst or a precursor thereof. Specific examples of the ionic polar group include a carboxylic acid group, a sulfonate group, a phosphato group, and a boronate group. Among them, preferred is a carboxylic acid group from the viewpoint of moderate acidity (not degrading other functional groups).

The preferred content of each unit in the second preferred aspect of the polymer is as follows.

The content of the repeating unit represented by Formula (A) is preferably 5 to 50 mol % and more preferably 5 to 30 mol % with respect to the total repeating units in the polymer, from the viewpoint of reactivity (curability and polymerizability) and inhibition of gelation during synthesis.

The content of the repeating unit represented by Formula (B) is preferably 5 to 75 mol % and more preferably 10 to 70 mol % with respect to the total repeating units in the polymer, from the viewpoint of adsorptivity to a plating catalyst or a precursor thereof.

The content of the repeating unit represented by Formula (C) is preferably 10 to 70 mol %, more preferably 20 to 60 mol %, and still more preferably 30 to 50 mol % with respect to the total repeating units in the polymer, from the viewpoint of developability with an aqueous solution and humidity-resistant adhesiveness.

Specific examples of the above-mentioned polymer include polymers described in paragraphs [0106] to [0112] of JP2009-007540A, polymers described in paragraphs [0065] to of JP2006-135271A, and polymers described in paragraphs [0030] to [0108] of US2010-080964A.

These polymers can be prepared by known methods (for example, methods in the literature listed above).

(Preferred Aspect of Monomer)

In a case where the compound is a so-called monomer, a compound represented by Formula (X) can be mentioned as a preferred aspect.

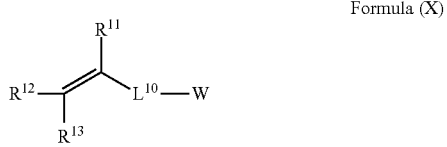

Formula (X)

In Formula (X), $R^{11}$ to $R^{13}$ each independently represent a hydrogen atom or a substituted or unsubstituted alkyl group. Examples of the unsubstituted alkyl group include a methyl group, an ethyl group, a propyl group, and a butyl group. Examples of the substituted alkyl group include a methyl group, an ethyl group, a propyl group, and a butyl group each of which is substituted with a methoxy group, a chlorine atom, a bromine atom, a fluorine atom, or the like. $R^{11}$ is preferably a hydrogen atom or a methyl group. $R^{12}$ is preferably a hydrogen atom. $R^{13}$ is preferably a hydrogen atom.

$L^{10}$ represents a single bond or a divalent organic group. Examples of the divalent organic group include a substituted or unsubstituted aliphatic hydrocarbon group (preferably having 1 to 8 carbon atoms), a substituted or unsubstituted aromatic hydrocarbon group (preferably having 6 to 12 carbon atoms), —O—, —S—, —SO$_2$—, —N(R)— (R: alkyl group), —CO—, —NH—, —COO—, —CONH—, or a group formed by combining these groups (for example, an alkyleneoxy group, an alkyleneoxycarbonyl group, or an alkylenecarbonyloxy group).

The substituted or unsubstituted aliphatic hydrocarbon group is preferably a methylene group, an ethylene group, a propylene group or a butylene group, or such a group substituted with a methoxy group, a chlorine atom, a bromine atom, a fluorine atom, or the like.

The substituted or unsubstituted aromatic hydrocarbon group is preferably an unsubstituted phenylene group, or a phenylene group substituted with a methoxy group, a chlorine atom, a bromine atom, a fluorine atom, or the like.

In Formula (X), one preferred aspect of $L^{10}$ may be, for example, a —NH— aliphatic hydrocarbon group- or a —CO— aliphatic hydrocarbon group-.

W has the same definition of W in Formula (b) and represents an interactive group. The definition of the interactive group is as described above.

In Formula (X), a preferred aspect of W may be, for example, an ionic polar group and is more preferably a carboxylic acid group.

In a case where the above-mentioned compound is a so-called monomer, a compound represented by Formula (1) may be mentioned as one of the other preferred aspect.

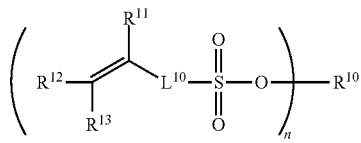

Formula (1)

In Formula (1), $R^{10}$ represents a hydrogen atom, a metal cation, or a quaternary ammonium cation. Examples of the metal cation include an alkali metal cation (a sodium ion or a calcium ion), a copper ion, a palladium ion, and a silver ion. Further, a monovalent or divalent metal cation is generally used as the metal cation. In a case where the divalent metal cation (for example, a palladium ion) is used, n to be described hereinafter represents 2.

Examples of the quaternary ammonium cation include a tetramethyl ammonium ion and a tetrabutyl ammonium ion.

Among them, preferred is a hydrogen atom from the viewpoint of adhesion of a plating catalyst or a precursor thereof, and metal residues after patterning.

$L^{10}$ in Formula (1) has the same definition of $L^{10}$ in Formula (X) and represents a single bond or a divalent organic group. The definition of the divalent organic group is as described above.

$R^{11}$ to $R^{13}$ in Formula (1) have the same definition of $R^{11}$ to $R^{13}$ in Formula (X) and represent a hydrogen atom or a substituted or unsubstituted alkyl group. Preferred aspects of $R^{11}$ to $R^{13}$ are as described above.

n represents an integer of 1 or 2. n is preferably 1 from the viewpoint of availability of the compound.

A compound represented by Formula (2) may be mentioned as a preferred aspect of the compound represented by Formula (1).

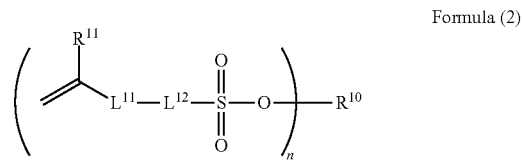

Formula (2)

In Formula (2), $R^{10}$, $R^{11}$, and n are as defined above.

$L^{11}$ represents an ester group (—COO—), an amide group (—CONH—), or a phenylene group. Among them, if $L^{11}$ is an amide group, solvent resistance (for example, alkali solvent resistance) is improved.

$L^{12}$ represents a single bond, a divalent aliphatic hydrocarbon group (preferably having 1 to 8 carbon atoms, and more preferably having 3 to 5 carbon atoms), or a divalent aromatic hydrocarbon group. The aliphatic hydrocarbon group may be linear, branched, or cyclic. In a case where $L^{12}$ is a single bond, $L^{11}$ represents a phenylene group.

The molecular weight of the compound represented by Formula (1) is not particularly limited, but it is preferably 100 to 1,000 and more preferably 100 to 300 from the viewpoint of volatility, solubility in a solvent, film forming properties, and handleability.

(Composition Y)

The composition Y is a composition containing a compound having an interactive group and a compound having a polymerizable group. That is, the layer for forming a layer to be plated contains two compounds: a compound having an interactive group and a compound having a polymerizable group. The definition of the interactive group and the polymerizable group is as described above.

The compound having an interactive group is a compound having an interactive group. The definition of the interactive group is as described above. Such a compound may be a low molecular weight compound or a polymer compound. A preferred aspect of the compound having an interactive group may be, for example, a polymer having a repeating unit represented by Formula (b) as described above (for example, polyacrylic acid). Further, a polymerizable group is not contained in the compound having an interactive group.

The compound having a polymerizable group is a so-called monomer, and is preferably a polyfunctional monomer having two or more polymerizable groups from the viewpoint of superior hardness of a layer to be plated which will be described. With regard to the polyfunctional monomer, specifically, it is preferred to use a monomer having 2 to 6 polymerizable groups. From the viewpoint of mobility of molecules during the crosslinking reaction which affects the reactivity, the molecular weight of the polyfunctional monomer to be used is preferably 150 to 1,000 and more preferably 200 to 700. Further, the space (distance) between a plurality of polymerizable groups is preferably 1 to 15 atoms and more preferably 6 to 10 atoms.

The compound having a polymerizable group may contain an interactive group.

One preferred form of the compound having a polymerizable group may be, for example, a compound represented by the following Formula (1).

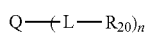

Formula (1)

In Formula (1), $R_{20}$ represents a polymerizable group.

L represents a single bond or a divalent organic group. The definition of the divalent organic group is as described above.

Q represents an n-valent organic group. Preferred examples of the n-valent organic group include a group represented by the following Formula (1A), a group represented by the following Formula (1B),

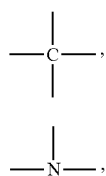

—NH—, —NR (R: alkyl group)—, —O—, —S—, a carbonyl group, an alkylene group, an alkenylene group, an alkynylene group, a cycloalkylene group, an aromatic group, a heterocyclic group, and an n-valent organic group formed by combining two or more such groups.

n represents an integer of 2 or more and preferably 2 to 6.

The mass ratio of the compound having an interactive group:the compound having a polymerizable group (mass of the compound having an interactive group/mass of the compound having a polymerizable group) is not particularly limited, but it is preferably 0.1 to 10 and more preferably 0.5 to 5 in terms of balance of strength and plating suitability of a layer to be plated which will be formed.

The content of the compound X (or composition Y) in the layer for forming a layer to be plated is not particularly limited, but it is preferably 50 mass % or more and more preferably 80 mass % or more with respect to the total mass of the layer for forming a layer to be plated. The upper limit is not particularly limited, but it is preferably 99.5 mass % or less.

The layer for forming a layer to be plated may contain components other than the above-mentioned polymerization initiator, compound X, and composition Y.

For example, the layer for forming a layer to be plated may contain a monomer (excluding the compound represented by Formula (X) or Formula (1)). The inclusion of a monomer can result in appropriate control of a crosslinking density or the like in the layer to be plated.

The monomer to be used is not particularly limited. For example, there are a compound having an ethylenically unsaturated bond as a compound having addition polymerizability, and a compound having an epoxy group as a compound having a ring-opening polymerizability. Among them, from the viewpoint of improving a crosslinking density in the layer to be plated, it is preferred to use a polyfunctional monomer. The polyfunctional monomer refers to a monomer having two or more polymerizable groups. Specifically, it is preferred to use a monomer having 2 to 6 polymerizable groups.

If necessary, other additives (for example, a sensitizer, a curing agent, a polymerization inhibitor, an antioxidant, an antistatic agent, a filler, particles, a flame retardant, a surfactant, a lubricant, and a plasticizer) may be added to the layer for forming a layer to be plated.

(Method for Manufacturing Laminate)

The method for manufacturing the laminate including a substrate and layers for forming a layer to be plated disposed on both surfaces of the substrate is not particularly limited, and examples thereof include a method in which a composition containing a variety of the above-described components is applied onto both surfaces of a substrate to form layers for forming a layer to be plated, thereby forming a laminate (coating method), and a method in which layers for forming a layer to be plated are formed on a temporary substrate and then transferred on both surfaces of the substrate (transfer method). Among them, a coating method is preferred from the viewpoint of easy control of thickness.

Hereinafter, aspects of the coating method will be described in detail.

The composition used in the coating method contains at least the above-described polymerization initiator and compound X or composition Y. The composition may contain the above-described other components, if necessary.

Further, the composition preferably contains a solvent, from the viewpoint of handleability.

The solvent that can be used is not particularly limited, and examples thereof include water; an alcohol-based solvent such as methanol, ethanol, propanol, ethylene glycol, 1-methoxy-2-propanol, glycerin, or propylene glycol monomethyl ether; an acid such as acetic acid; a ketone-based solvent such as acetone, methyl ethyl ketone, or cyclohexanone; an amide-based solvent such as formamide, dimethylacetamide, or N-methylpyrrolidone; a nitrile-based solvent such as acetonitrile or propionitrile; an ester-based solvent such as methyl acetate or ethyl acetate; a carbonate-based solvent such as dimethyl carbonate or diethyl carbonate; in addition to those, an ether-based solvent, a glycol-based solvent, an amine-based solvent, a thiol-based solvent, and a halogen-based solvent.

Among them, an alcohol-based solvent, an amide-based solvent, a ketone-based solvent, a nitrile-based solvent, or a carbonate-based solvent is preferred.

The content of the solvent in the composition is not particularly limited, but it is preferably 50 to 98 mass % and more preferably 70 to 95 mass % with respect to the total amount of the composition. When the content of the solvent is within the above-specified range, handleability of the composition is excellent and control of the layer thickness is easy.

In a case of the coating method, a method of applying a composition onto a substrate is not particularly limited and a known method (for example, spin coating, die coating, or dip coating) can be used.

In order to dispose layers for forming a layer to be plated on both surfaces of a substrate, the composition may be applied onto surfaces of the substrate one by one, or the composition may be applied onto both surfaces of the substrate at one time by immersing the substrate in the composition.

From the viewpoint of handleability and manufacturing efficiency, preferred is an aspect in which the composition is applied onto the substrate, and if necessary, a drying process is carried out to remove the remaining solvent, thereby forming a layer for forming a layer to be plated.

The conditions for the drying process are not particularly limited. From the viewpoint of superior productivity, it is preferable that the drying process is carried out at room temperature to 220° C. (preferably 50° C. to 120° C.) for 1 to 30 minutes (preferably 1 to 10 minutes).

The thickness of the layer for forming a layer to be plated is not particularly limited, but it is preferably 0.01 to 20 μm, more preferably 0.1 to 10 μm, and still more preferably 0.1 to 5 μm.

Further, the laminate may include other layers other than a substrate and a layer for forming a layer to be plated.

For example, a primer layer may be disposed between the substrate and the layer for forming a layer to be plated. The disposition of the primer layer results in improved adhesiveness between a patterned layer to be plated to be described hereinafter and a substrate.

In order to increase adhesiveness of the patterned layer to be plated by way of the primer layer, it may employ a variety of means improving a pressure sensitive adhesive force such as control of surface energy, formation of a chemical bond with a patterned layer to be plated, and use of a pressure sensitive adhesive force due to stress relaxation. In a case of surface energy control, for example, it is possible to use a low molecular weight layer or polymer layer close to the surface energy of the patterned layer to be plated. In a case of chemical bond formation, it is possible to use a low molecular weight layer or polymer layer having a polymerization active site. In a case of using a pressure sensitive adhesive force due to stress relaxation, it is possible to use a rubber-like resin having a low modulus of elasticity.

The thickness of the primer layer is not particularly limited. Generally, the thickness of the primer layer is preferably 0.01 to 100 μm, more preferably 0.05 to 20 μm, and still more preferably 0.05 to 10 μm.

The material for the primer layer is not particularly limited, but it is preferably a resin having good adhesiveness with a substrate. A specific example of the resin may be a thermosetting resin, a thermoplastic resin, or a mixture thereof. Examples of the thermosetting resin include an epoxy resin, a phenol resin, a polyimide resin, a polyester resin, a bismaleimide resin, a polyolefin-based resin, and an isocyanate-based resin. Examples of the thermoplastic resin include a phenoxy resin, polyether sulfone, polysulfone, polyphenylene sulfone, polyphenylene sulfide, polyphenyl ether, polyether imide, and an acrylonitrile butadiene styrene (ABS) resin.

The thermoplastic resins and the thermosetting resins may be respectively used alone or in combination of two or more thereof. Further, a resin containing a cyano group may be used. Specifically, an ABS resin, and "polymers containing a unit having a cyano group on the side chain" described in paragraphs [0039] to [0063] of JP2010-84196A may also be used.

Further, it may also be possible to use a rubber component such as acrylonitrile·butadiene rubber (NBR rubber) or styrene·butadiene rubber (SBR rubber).

One preferred aspect of the material constituting a primer layer may be, for example, a polymer having a conjugated diene compound unit which may be hydrogenated. The conjugated diene compound unit refers to a repeating unit derived from a conjugated diene compound. The conjugated diene compound is not particularly limited as long as it is a compound having a molecular structure having two carbon-carbon double bonds separated by one single bond.

One preferred aspect of the repeating unit derived from a conjugated diene compound may be, for example, a repeating unit generated by polymerization reaction of a compound having a butadiene skeleton.

The conjugated diene compound unit may be hydrogenated, and in a case of containing a hydrogenated conjugated diene compound unit, adhesiveness of a patterned metal layer is preferably further improved. That is, the double bond in the repeating unit derived from a conjugated diene compound may be hydrogenated.

The polymer having a conjugated diene compound unit which may be hydrogenated may also contain the above-described interactive group.

Examples of preferred aspects of this polymer include an acrylonitrile butadiene rubber (NBR), a carboxyl group-containing nitrile rubber (XNBR), an acrylonitrile-butadiene-isoprene rubber (NBIR), an acrylonitrile-butadiene-styrene copolymer (ABS resin), and a hydrogenated product thereof (for example, a hydrogenated acrylonitrile butadiene rubber).

The primer layer may also contain other additives (for example, a sensitizer, an antioxidant, an antistatic agent, an ultraviolet absorber, a filler, particles, a flame retardant, a surfactant, a lubricant, and a plasticizer).

The method of forming a primer layer is not particularly limited, and examples thereof include a method in which a resin to be used is laminated on a substrate, and a method in which necessary components are dissolved in a solvent capable of dissolving such components, followed by coating and drying on a substrate surface by a method such as coating.

With respect to the heating temperature and time in a coating method, the conditions under which a coating solvent can be sufficiently dried may be selected. From the viewpoint of manufacturing suitability, it is preferred to select the heating conditions in which the heating temperature is 200° C. or lower and the heating time is in the range of within 60 minutes, and it is more preferred to select the heating conditions in which the heating temperature is 40° C. to 100° C. and the heating time is in the range of within 20 minutes. Regarding the solvent to be used, an optimum solvent (for example, cyclohexanone or methyl ethyl ketone) is suitably selected depending on the resin to be used.

<Irradiating Step>

This step is a step of irradiating light in a patternwise fashion onto two layers for forming a layer to be plated in the laminate prepared in the above step (a step of performing exposure in a patternwise fashion). That is, this step is a step including at least a step of irradiating one layer for forming a layer to be plated disposed on one main surface of the substrate with light of a wavelength to which a polymerization initiator is exposed in a patternwise fashion, from one main surface side of the substrate in the laminate, and a step of irradiating the other layer for forming a layer to be plated disposed on the other main surface of the substrate with light of a wavelength to which a polymerization initiator is exposed in a patternwise fashion, from the other main surface of the substrate. Further, as will be described hereinafter, the non-irradiated region of the layer for forming a layer to be plated is removed to thereby form a patterned layer to be plated. Further, the above-mentioned light corresponds to light having a wavelength of the shorter wavelength side than the absorption edge on the long wavelength side of the ultraviolet-visible absorption spectrum of the substrate and also having a wavelength to which a polymerization initiator is exposed.

Figure 5B:
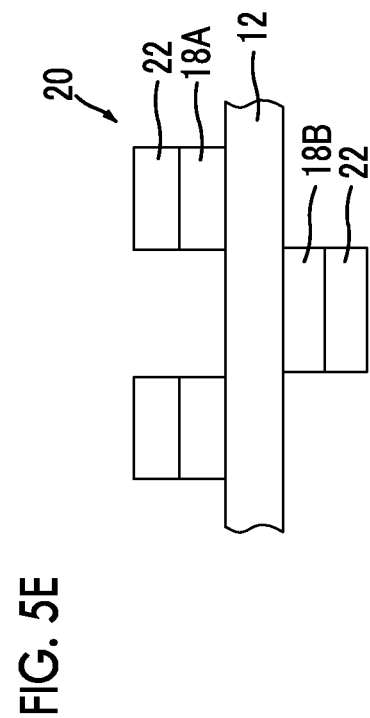
Figure 5C:
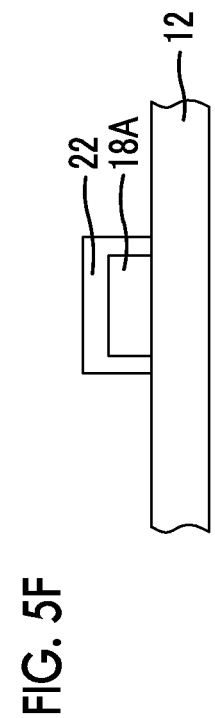

More specifically, first, as shown in FIG. 5B, a predetermined irradiation region 16A (region where light is irradiated) of a first layer 14A for forming a layer to be plated is irradiated with light of a wavelength to which the polymerization initiator is exposed. Next, as shown in FIG. 5C, a predetermined irradiation region 16B of a second layer 14B for forming a layer to be plated is irradiated with light of a wavelength to which the polymerization initiator is exposed. As described above, in the present embodiment, since the light irradiated to the first layer 14A for forming a layer to be plated is absorbed by the substrate 12, such light is suppressed from reaching to the second layer 14B for forming a layer to be plated. Further, with respect to the light irradiated to the second layer 14B for forming a layer to be plated, since it is absorbed by the substrate 12, such light is suppressed from reaching to the first layer 14A for forming a layer to be plated. As a result, it is possible to form desired irradiation regions on the first layer 14A for forming a layer to be plated and the second layer 14B for forming a layer to be plated.

Hereinafter, with respect to the procedure of this step, a first irradiating step of irradiating light of a predetermined wavelength in a patternwise fashion on the first layer for forming a layer to be plated disposed on one main surface of the substrate, and the second irradiating step of irradiating light of a predetermined wavelength in a patternwise fashion on the second layer for forming a layer to be plated disposed on the other main surface of the substrate will be described separately. Further, the first irradiating step and the second irradiating step may be carried out simultaneously.

(First Irradiating Step)

This step is a step of irradiating a first layer for forming a layer to be plated disposed on one main surface of a substrate with light of a wavelength to which a polymerization initiator is exposed in a patternwise fashion, from one main surface side of the substrate in the laminate. That is, patternwise light irradiation is carried out so as to satisfy the following requirement 1.

Requirement 1: in a case where the absorption edge on the long wavelength side of the ultraviolet-visible absorption spectrum of the polymerization initiator is present in the shorter wavelength side than the absorption edge on the long wavelength side of the ultraviolet-visible absorption spectrum of the substrate, the layer for forming a layer to be plated is irradiated in a patternwise fashion with light of a wavelength to which a polymerization initiator is exposed.

The light-irradiated region undergoes polymerization between polymerizable groups or a reaction between the substrate and the polymerizable group, and is cured to become an insoluble portion. This insoluble portion becomes a so-called layer to be plated.

The light irradiated to the first layer for forming a layer to be plated in this step is light of a wavelength to which a polymerization initiator in the layer for forming a layer to be plated is exposed. More specifically, it is light having a wavelength of the shorter wavelength side than the absorption edge on the long wavelength side of the ultraviolet-visible absorption spectrum of the polymerization initiator. Further, it may be sufficient if the light irradiated to the first layer for forming a layer to be plated in this step contains light of a wavelength to which the polymerization initiator is exposed, and such light may contain light having other wavelengths. That is, it may be sufficient if the light irradiated to the first layer for forming a layer to be plated contains light of a wavelength to which the polymerization initiator is exposed, and such light may contain light having a wavelength of the longer wavelength side than the absorption edge on the long wavelength side of the ultraviolet-visible absorption spectrum of the polymerization initiator.

The light to be irradiated may be monochromatic light or continuous light if it satisfies the above requirement. When the light satisfying the requirement as described above is irradiated, there is a method of appropriately selecting a light source, or a method of selecting light of a particular wavelength using a light source and a predetermined light-blocking filter.

The method of applying energy in a patternwise fashion on a first layer for forming a layer to be plated on a substrate is not particularly limited.

The light source used for irradiation is not particularly limited and may be sufficient as long as it is capable of emitting light of the above-mentioned wavelength. For example, a UV lamp, light irradiation by way of visible light or the like is used. Examples of the light source include a mercury lamp, a metal halide lamp, a xenon lamp, a chemical lamp, and a carbon arc lamp.

The exposure time varies depending on the reactivity and light source and is usually 10 seconds to 5 hours. The exposure energy may be about 10 to 8,000 mJ and is preferably in the range of 50 to 3,000 mJ.

The method of carrying out the above exposure process in a patternwise fashion is not particularly limited and a known method may be employed. For example, exposure light may be irradiated on a first layer for forming a layer to be plated through a mask.

(Second Irradiating Step)

This step is a step of irradiating a second layer for forming a layer to be plated disposed on the other main surface of a substrate with light of a wavelength to which a polymerization initiator is exposed in a patternwise fashion, from the other main surface of the substrate in the laminate. That is, patternwise light irradiation is carried out so as to satisfy the above-described requirement 1 also in this step.

The procedure of this step is the same as in the above-described first irradiating step. Irradiation conditions of the first irradiating step and the second irradiating step may be different.

Further, the pattern shape to be irradiated in this step may be different from the pattern shape of the first irradiating step.

<Removing Step>

Figure 5D:
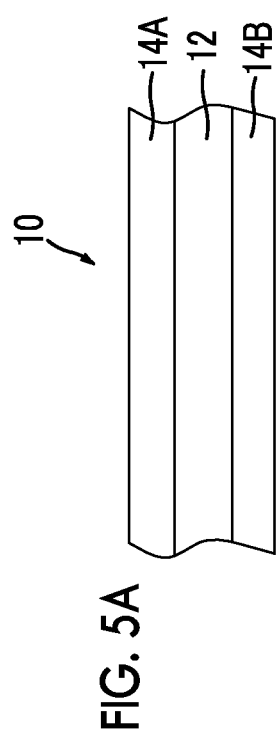

This step is a step of removing the non-irradiated regions (unexposed regions) of the layers for forming a layer to be plated (first layer for forming a layer to be plated and second layer for forming a layer to be plated) which have been subjected to the above-mentioned irradiating steps (first irradiating step and second irradiating step). By carrying out this step, non-irradiated regions in the layers for forming a layer to be plated are removed, and patterned layers to be plated (a first patterned layer to be plated and a second patterned layer to be plated) are formed. More specifically, as shown in FIG. 5D, by subjecting the resulting laminate to this process, non-irradiated regions are removed to thereby obtain a laminate 20 containing patterned layers to be plated, which have a first patterned layer 18A to be plated and a second patterned layer 18B to be plated.

The above-mentioned removing method is not particularly limited, and the optimum method is appropriately selected depending on the compound contained in the layer for forming a layer to be plated. Usually, there may be mentioned a method in which a solvent in which the compound is dissolved is brought into contact with a layer for forming a layer to be plated.

More specifically, there may be mentioned a method in which an alkaline solution is used as a developer. In a case where non-irradiated regions are removed using an alkaline solution, there may be mentioned a method in which a laminate subjected to an irradiating step is immersed in an alkaline solution or a method in which an alkaline solution is applied onto the layer for forming a layer to be plated. The immersion method is preferred. In a case of the immersion method, the immersion time is preferably about 1 to 30 minutes from the viewpoint of productivity and workability.

According to the above procedure, a laminate containing patterned layers to be plated, which has a substrate and patterned layers to be plated disposed on both surfaces of the substrate, is obtained.

This laminate can be suitably applied to applications for forming a metal film (conductive film). That is, by applying a plating catalyst or a precursor thereof to patterned layers to be plated in the laminate to further carry out a plating treatment, it is possible to form metal layers on the patterned layers to be plated. That is, by controlling the shape of the patterned layers to be plated, it is possible to control the pattern of the metal layers. Further, by using such patterned layers to be plated, adhesiveness of a metal layer to a substrate is excellent.

Hereinafter, the step of forming a metal layer (metal layer forming step) will be described in detail.

<Metal Layer Forming Step>

Figure 5E:
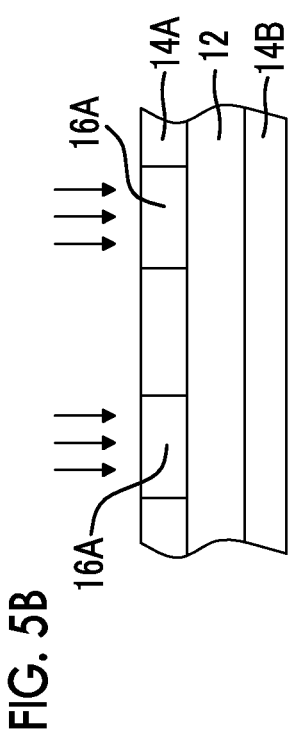

This step is a step in which a plating catalyst or a precursor thereof is applied to a patterned layer to be plated in a laminate containing patterned layers to be plated, a plating treatment is carried out on the patterned layer to be plated to which the plating catalyst or the precursor thereof has been applied, and a metal layer is formed on the patterned layer to be plated. More specifically, by carrying out this step, as shown in FIG. 5E, a metal layer 22 is formed on a first patterned layer 18A to be plated and a second patterned layer 18B to be plated, and therefore a metal layer-containing laminate 24 is obtained.

Hereinafter, a step of applying a plating catalyst or a precursor thereof to patterned layers to be plated (first patterned layer to be plated and second patterned layer to be plated) (step X), and a step of carrying out a plating treatment on patterned layers to be plated to which the plating catalyst or the precursor thereof has been applied (step Y) will be described separately.

(Step X: Plating Catalyst Applying Step)

In this step, first, a plating catalyst or a precursor thereof is applied to a patterned layer to be plated. The interactive group derived from the aforementioned compound deposits (adsorbs) the applied plating catalyst or a precursor thereof, according to the function thereof. More specifically, the plating catalyst or the precursor thereof is applied in the patterned layer to be plated and on the surface of the patterned layer to be plated.

The plating catalyst or the precursor thereof functions as a catalyst or electrode of a plating treatment. Therefore, the type of the plating catalyst or the precursor thereof to be used is appropriately determined in accordance with the type of the plating treatment.

Further, the plating catalyst or the precursor thereof to be used is preferably an electroless plating catalyst or a precursor thereof. Hereinafter, mainly, an electroless plating catalyst or a precursor thereof will be described in detail.

Any electroless plating catalyst may be used as the electroless plating catalyst used in this step as long as it serves as an active nucleus during electroless plating. Specifically, a metal having a catalytic capacity of the autocatalytic reduction reaction (which is known as a metal capable of electroless plating with lower ionization tendency than Ni) may be used. Specific examples thereof include Pd, Ag, Cu, Ni, Pt, Au, and Co. Among them, particularly preferred is Ag, Pd, Pt, or Cu from the viewpoint of high catalytic capacity.

A metallic colloid may be used as the electroless plating catalyst.

The electroless plating catalyst precursor in this step can be used without any particular limitation as long as it may be converted into the electroless plating catalyst by a chemical reaction. Metal ions of the metals illustrated above for the electroless plating catalyst are mainly used. The metal ions which are the electroless plating catalyst precursors are converted by the reduction reaction into zero-valent metals which are the electroless plating catalysts. After the metal ion as the electroless plating catalyst precursor is applied to the patterned layer to be plated, the electroless plating catalyst precursor may be separately converted into a zero-valent metal as the electroless plating catalyst by the reduction reaction before being immersed in an electroless plating bath. Alternatively, the electroless plating catalyst precursor may be immersed into the electroless plating bath without any treatment to be converted into a metal (electroless plating catalyst) by the action of a reducing agent in the electroless plating bath.

A metal salt is preferably used to apply the metal ion as the electroless plating catalyst precursor to the patterned layer to be plated. The metal salt used is not particularly limited as long as it dissolves in a suitable solvent to be dissociated into a metal ion and a base (anion). Examples thereof include $M(NO_3)_n$, $MCl_n$, $M_{2/n}(SO_4)$, and $M_{3/n}(PO_4)$ (M represents an n-valent metal atom). The metal ion resulting from the dissociation of the metal salt may be preferably used. Specific examples of the metal ion include Ag ion, Cu ion, Ni ion, Co ion, Pt ion, and Pd ion. Among them, ions capable of multidentate coordination are preferred. Ag ion, Pd ion, and Cu ion are particularly preferred from the viewpoint of the number of types of functional groups capable of coordination and the catalytic capacity.

In this step, a zero-valent metal may be used as the catalyst used for carrying out direct electroplating without electroless plating.

Examples of the method of applying a plating catalyst or a precursor thereof to a patterned layer to be plated include a method which involves preparing a solution of a plating catalyst or a precursor thereof dispersed or dissolved in a suitable solvent (catalyst-applying liquid containing a plating catalyst or a precursor thereof and a solvent), and applying the solution to the patterned layer to be plated and a method which involves immersing the laminate having the patterned layer to be plated formed thereon in the solution.

Water and an organic solvent are appropriately used for the solvent above. The organic solvent is preferably a solvent which can penetrate into a patterned layer to be plated, and examples thereof include acetone, methyl acetoacetate, ethyl acetoacetate, ethylene glycol diacetate, cyclohexanone, acetylacetone, acetophenone, 2-(1-cyclohexenyl)cyclohexanone, propylene glycol diacetate, triacetin, diethylene glycol diacetate, dioxane, N-methylpyrrolidone, dimethyl carbonate, and dimethyl cellosolve.

The pH of the catalyst-applying liquid containing a plating catalyst or a precursor thereof and a solvent is not particularly limited, but it is preferably 3.0 to 7.0, more preferably 3.2 to 6.8, and still more preferably 3.5 to 6.6 from the viewpoint of easy formation of a metal layer in a desired amount at a desired position at the time of a plating treatment to be described hereinafter.

The method for preparing a catalyst-applying liquid is not particularly limited, and involves dissolving a predetermined metal salt in a suitable solvent, and if necessary, adjusting a pH to a predetermined range using an acid or alkali.

The concentration of the plating catalyst or the precursor thereof in the solution is not particularly limited, but it is preferably 0.001 to 50 mass % and more preferably 0.005 to 30 mass %.

The contact time is preferably about 30 seconds to 24 hours and more preferably about 1 minute to 1 hour.

The adsorbed amount of the plating catalyst or the precursor thereof of the patterned layer to be plated varies depending on a plating bath species to be used, a catalyst metal species, an interactive group species of a patterned layer to be plated, usage and the like, but it is preferably 5 to 1,000 mg/m$^2$, more preferably 10 to 800 mg/m$^2$, and particularly preferably 20 to 600 mg/m$^2$ from the viewpoint of deposition property of plating.

(Step Y: Plating Treatment Step)

Next, a plating treatment is carried out on the patterned layer to be plated to which a plating catalyst or a precursor thereof has been applied.

The method of a plating treatment is not particularly limited, and examples thereof include an electroless plating treatment and an electrolytic plating treatment (electroplating treatment). In this step, an electroless plating treatment may be carried out alone, or an electrolytic plating treatment may be further carried out following an electroless plating treatment.

In the present specification, a so-called silver mirror reaction is included as one type of the above-mentioned electroless plating treatment. Thus, a desired patterned metal layer may be formed by reducing the deposited metal ions, for example, by a silver mirror reaction or the like, and thereafter an electrolytic plating treatment may be further carried out.

Hereinafter, the procedure of the electroless plating treatment and electrolytic plating treatment will be described in detail.

The electroless plating treatment refers to an operation of depositing metals through a chemical reaction using a solution of metal ions to be deposited as plating dissolved therein.

For example, the electroless plating in this step is preferably carried out in such a manner that a laminate having the patterned layer to be plated to which an electroless plating catalyst has been applied is washed with water to remove an excess of the electroless plating catalyst (metal), and then immersed in an electroless plating bath. As the electroless plating bath to be used, a known electroless plating bath may be employed.

Further, in a case where a substrate having the patterned layer to be plated to which an electroless plating catalyst precursor has been applied is immersed in an electroless plating bath in a state of an electroless plating catalyst precursor being adsorbed or impregnated in the patterned layer to be plated, it is preferred that a laminate is washed with water to remove an excess of the electroless plating catalyst precursor (such as a metal salt), and then immersed in the electroless plating bath. In this case, the reduction of the electroless plating catalyst precursor and subsequently the electroless plating are carried out in the electroless plating bath. Also with respect to the electroless plating bath used herein, a known electroless plating bath may be employed in the same manner as described above.

Further, apart from the aspect of using an electroless plating liquid as described above, the reduction of an electroless plating catalyst precursor can also be carried out with the preparation of a catalyst activating liquid (reduction liquid), as a separate step prior to electroless plating.

In addition to the solvent (for example, water), the general composition of the electroless plating bath mainly contains: 1. a metal ion for plating, 2. a reducing agent, and 3. an additive enhancing the stability of metal ions (stabilizer). In addition to these ingredients, this plating bath may contain known additives such as a stabilizer for the plating bath.

The organic solvent that may be used in the electroless plating bath is to be soluble in water and in view of this, ketones such as acetone, and alcohols such as methanol, ethanol and isopropanol are preferably used. For example, copper, tin, lead, nickel, gold, silver, palladium and rhodium are known metals that may be used in the electroless plating bath. Of these, copper, silver, or gold is preferred, and copper is more preferred from the viewpoint of electrical conductivity. The most appropriate reducing agent and additives are selected for the metal used.

The immersion time in the electroless plating bath is preferably about 1 minute to about 6 hours and more preferably about 1 minute to about 3 hours.

In this step, in a case where a plating catalyst or a precursor thereof that has been applied to the patterned layer to be plated functions as an electrode, electroplating can be carried out on the patterned layer to be plated to which the catalyst or the precursor thereof has been applied.

As described above, in this step, if necessary, an electrolytic plating treatment may be carried out after the electroless plating treatment. In such an aspect, the thickness of a metal layer to be formed is appropriately adjustable.

Any conventionally known method may be used for electroplating. Examples of the metal that may be used in electroplating include copper, chromium, lead, nickel, gold, silver, tin, and zinc. From the viewpoint of electrical conductivity, copper, gold or silver is preferred and copper is more preferred.

By carrying out the above-mentioned steps, it is possible to form a metal layer (plating layer) on a patterned layer to be plated.

In a case of using a subtractive method described in JP2012-097296A mentioned hereinbefore, because layers to be plated composed of a hydrophilic resin or the like are present between the patterned metal layers, it is easy to cause migration of metal ions due to the influence of the layers to be plated between the metal layers when the pattern of the metal layers is finer, and therefore there is a concern that insulation properties are lowered. On the other hand, the above-mentioned procedure of the present invention is a so-called additive method in which a patterned layer to be plated is formed, and a metal layer corresponding to a conductive layer is formed on the patterned layer to be plated. Since layers to be plated do not remain between metal layers in a metal layer-containing laminate which is obtained by this method, occurrence of metal ion migration is further suppressed and therefore such a laminate can be suitably used as a conductive film for a touch panel sensor.

Figure 5F:
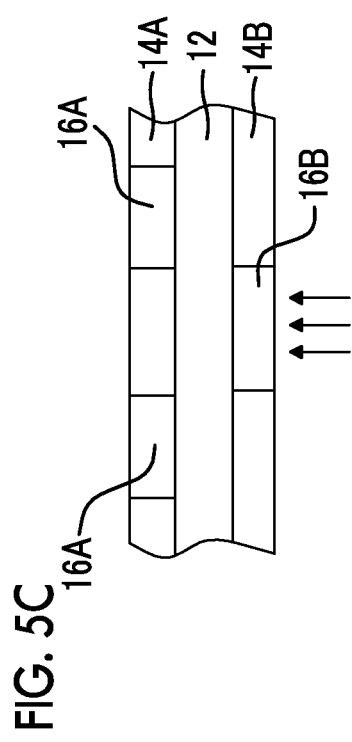

Although FIG. 5E shows an aspect in which a metal layer 22 is disposed only on the upper surface of the first patterned layer 18A to be plated, without being limited to this aspect, as shown in FIG. 5F, there may be an aspect in which the metal layer 22 is disposed on a surface other than the contact surface with a substrate 12 of the first patterned layer 18A to be plated. That is, the metal layer may be disposed so as to cover the surface other than the contact surface with the substrate of a patterned layer to be plated.

(Applications)

The metal layer-containing laminate having a metal layer obtained by the above treatment is applicable to various applications, including, for example, touch panels (or touch panel sensors), semiconductor chips, various electrical wiring boards, Flexible Printed Circuits (FPCs), Chip on Film (COF), Tape Automated Bonding (TAB), antennae, multilayer wiring substrates, and mother boards. Among them, it is preferable to use such a metal layer-containing laminate in a touch panel sensor (capacitive touch panel sensor). In a case where it is desired to apply the metal layer-containing laminate to a touch panel sensor, the metal layer in the metal layer-containing laminate functions as a detection electrode or lead wire in the touch panel sensor.

In the present specification, a combination of a touch panel sensor with various display devices (for example, a liquid crystal display device, and an organic electro-luminescence (EL) display device) is referred to as a touch panel. The touch panel may be preferably, for example, a capacitive touch panel.

Figure 7:
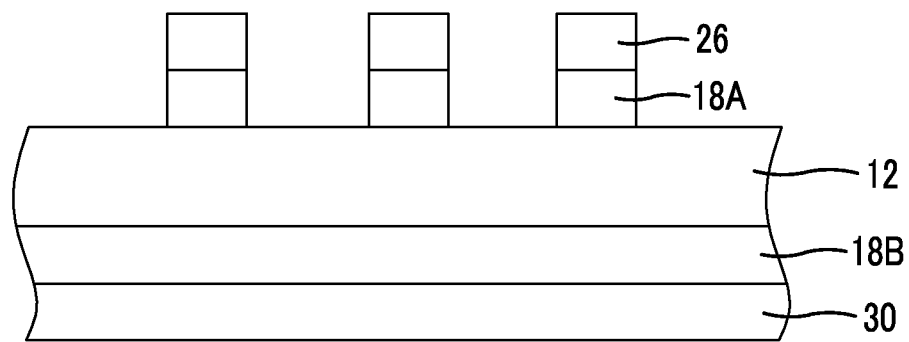
FIG. 7 is a sectional view taken along section line A-A in FIG. 6.

One embodiment of a case of applying a metal layer-containing laminate to a touch panel sensor is shown in FIGS. 6 and 7.

As shown in FIG. 6, the metal layer-containing laminate 124 includes a substrate 12, a first patterned layer 18A to be plated disposed on one main surface of the substrate 12, a first detection electrode 26 and a first lead wire 28 disposed on the first patterned layer 18A to be plated, a second patterned layer 18B to be plated disposed on the other main surface of the substrate 12, and a second detection electrode 30 and a second lead wire 32 disposed on the second patterned layer 18B to be plated. Further, the first detection electrode 26, the first lead wire 28, the second detection electrode 30, and the second lead wire 32 are formed of the metal layer described above.

With respect to manufacturing of such a metal layer-containing laminate, the laminate is obtained by forming the first patterned layer 18A to be plated and the second patterned layer 18B to be plated at positions desired to place the first detection electrode 26, the first lead wire 28, the second detection electrode 30, and the second lead wire 32, and forming metal layers thereon. That is, the first patterned layer 18A to be plated is disposed between the first detection electrode 26 and first lead wire 28 and the substrate 12, and the second patterned layer 18B to be plated is disposed between the second detection electrode 30 and second lead wire 32 and the substrate 12.

When a touch panel sensor including such a metal layer-containing laminate is incorporated as a component of a touch panel, the first detection electrode 26 and the second detection electrode 30 function as a sensing electrode for sensing a change in electrostatic capacitance and constitute a sensing unit. That is, when the fingertip contacts with the touch panel, mutual electrostatic capacitance between the first detection electrode 26 and the second detection electrode 30 is changed, and the position of the fingertip is calculated based on such an amount of change by an integrated circuit (IC).

The first detection electrode 26 serves to detect the input position in the X direction of the finger of the operator close to the input area of the touch panel sensor, and has a function of generating an electrostatic capacitance between the finger and the first detection electrode 26. The first detection electrode 26 is an electrode extending in the first direction (X direction) and arranged at a predetermined interval in the second direction (Y direction) perpendicular to the first direction.

The second detection electrode 30 serves to detect the input position in the Y direction of the finger of the operator close to the input area of the touch panel sensor, and has a function of generating an electrostatic capacitance between the finger and the second detection electrode 30. The second detection electrode 30 is an electrode extending in the second direction (Y direction) and arranged at a predetermined interval in the first direction (X direction). In FIG. 6, five first detection electrodes 26 and five second detection electrodes 30 are provided, and the number of the electrodes is not particularly limited as long as a plurality of electrode are present.

The first lead wire 28 and the second lead wire 32 are members responsible for applying a voltage to the first detection electrode 26 and the second detection electrode 30, respectively.

<<Second Embodiment>>

The second embodiment of the method for manufacturing a laminate containing patterned layers to be plated according to the present invention includes a step A of preparing a laminate having a substrate having two main surfaces and layers for forming a layer to be plated respectively disposed on two main surfaces of the substrate (a laminate preparing step), a step B of irradiating light in a patternwise fashion onto the layers for forming a layer to be plated (an irradiating step), and a step C of removing the non-irradiated regions in the layers for forming a layer to be plated to form patterned layers to be plated on both surfaces of a substrate (a step of forming a layer to be plated), in which the absorption edge on the long wavelength side of the ultraviolet-visible absorption spectrum of the polymerization initiator is present in the longer wavelength side than the absorption edge on the long wavelength side of the ultraviolet-visible absorption spectrum of the substrate.

Since the second embodiment is the same as the first embodiment, except that the positional relationship between the absorption edge on the long wavelength side of the ultraviolet-visible absorption spectrum of the polymerization initiator and the absorption edge on the long wavelength side of the ultraviolet-visible absorption spectrum of the substrate is different, and the irradiation conditions for a layer for forming a layer to be plated are different, and the procedures of individual steps are also the same therebetween, features of the second embodiment different from the first embodiment will be mainly described hereinafter.

In the second embodiment, the absorption edge on the long wavelength side of the ultraviolet-visible absorption spectrum of the polymerization initiator is present in the longer wavelength side than the absorption edge on the long wavelength side of the ultraviolet-visible absorption spectrum of the substrate. This relationship corresponds to the relationship described above with reference to FIG. 4.

The polymerization initiator or substrate to be used is appropriately selected so as to satisfy the above-mentioned relationship, and the polymerization initiator and the substrate described in the first embodiment are appropriately used.

In the second embodiment, it may be sufficient if the absorption edge on the long wavelength side of the ultraviolet-visible absorption spectrum of the polymerization initiator is positioned on the longer wavelength side than the absorption edge on the long wavelength side of the ultraviolet-visible absorption spectrum of the substrate, and a wavelength difference therebetween (wavelength (nm) of the absorption edge on the long wavelength side of the ultraviolet-visible absorption spectrum of the polymerization initiator—wavelength (nm) of the absorption edge on the long wavelength side of the ultraviolet-visible absorption spectrum of the substrate) is not particularly limited, but it is preferably 10 to 150 nm and more preferably 20 to 100 nm.

In the second embodiment, in a first irradiating step and a second irradiating step, a layer for forming a layer to be plated is irradiated in a patternwise fashion with light of a wavelength to which a polymerization initiator is exposed, as light excluding light of a wavelength longer than or equal to a wavelength of the absorption edge on the long wavelength side of the ultraviolet-visible absorption spectrum of the substrate and shorter than or equal to a wavelength of the absorption edge on the long wavelength side of the ultraviolet-visible absorption spectrum of the polymerization initiator. That is, patternwise light irradiation is carried out so as to satisfy the following requirement 2.

Requirement 2: in a case where the absorption edge on the long wavelength side of the ultraviolet-visible absorption spectrum of the polymerization initiator is present in the longer wavelength side than the absorption edge on the long wavelength side of the ultraviolet-visible absorption spectrum of the substrate, the layer for forming a layer to be plated is irradiated in a patternwise fashion with light of a wavelength to which a polymerization initiator is exposed, as light excluding light of a wavelength longer than or equal to a wavelength of the absorption edge on the long wavelength side of the ultraviolet-visible absorption spectrum of the substrate and shorter than or equal to a wavelength of the absorption edge on the long wavelength side of the ultraviolet-visible absorption spectrum of the polymerization initiator.

As described above, in the second embodiment, because the absorption edge of the ultraviolet-visible absorption spectrum of the polymerization initiator is positioned on the longer wavelength side than the absorption edge of the ultraviolet-visible absorption spectrum of the substrate, the polymerization initiator in the layer for forming a layer to be plated is exposed if the above-mentioned light is used.

Further, light having a wavelength of the shorter wavelength side than the absorption edge on the long wavelength side of the ultraviolet-visible absorption spectrum of the substrate is irradiated to the first layer for forming a layer to be plated in the first irradiating step, but similar to the first embodiment, the light transmitted through the first layer for forming a layer to be plated is absorbed by the substrate and does not reach the second layer for forming a layer to be plated on the opposite side. Also in the second irradiating step, similar to the first embodiment, the irradiated light is absorbed by the substrate.

Further, since light having a wavelength longer than or equal to a wavelength of the absorption edge on the long wavelength side of the ultraviolet-visible absorption spectrum of the substrate and shorter than or equal to a wavelength of the absorption edge on the long wavelength side of the ultraviolet-visible absorption spectrum of the polymerization initiator is not included in the light irradiated to the layer for forming a layer to be plated, for example, the polymerization initiator in the second layer for forming a layer to be plated can be suppressed from being exposed to the light irradiated to the first layer for forming a layer to be plated.

Further, with respect to the light irradiated to the layers for forming a layer to be plated (first layer for forming a layer to be plated and second layer for forming a layer to be plated) in the present aspect, as described above, such light does not contain light having a wavelength longer than or equal to a wavelength of the absorption edge on the long wavelength side of the ultraviolet-visible absorption spectrum of the substrate and shorter than or equal to a wavelength of the absorption edge on the long wavelength side of the ultraviolet-visible absorption spectrum of the polymerization initiator, and it may also be sufficient that such light contains light of a wavelength to which a polymerization initiator is exposed, and light of other wavelengths may be contained therein. That is, the light irradiated to the layer for forming a layer to be plated may contain light having a wavelength of the longer wavelength side than the absorption edge on the long wavelength side of the ultraviolet-visible absorption spectrum of the polymerization initiator.

Figure 8:
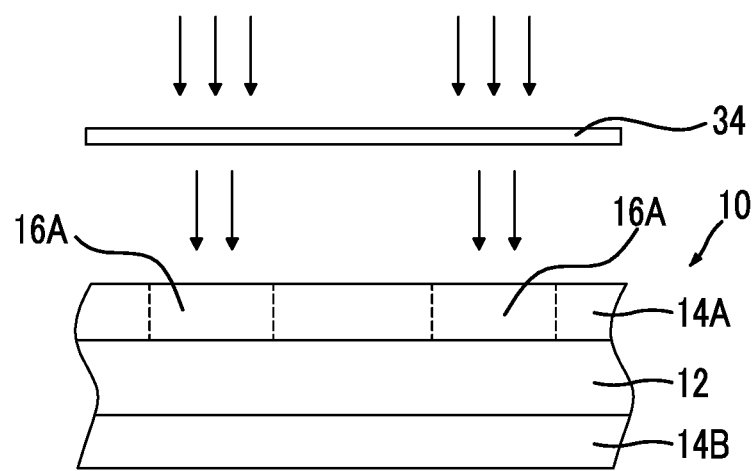
FIG. 8 is a diagram showing an outline of an irradiating step using a light-blocking filter.

With respect to the second embodiment, in the first irradiating step and the second irradiating step, light irradiation is preferably carried out using a light-blocking filter at least blocking the light of a wavelength longer than or equal to a wavelength of the absorption edge on the long wavelength side of the ultraviolet-visible absorption spectrum of the substrate and shorter than or equal to a wavelength of the absorption edge on the long wavelength side of the ultraviolet-visible absorption spectrum of the polymerization initiator. More specifically, as shown in FIG. 8, a light-blocking filter 34 is disposed between a light source (not shown) and a laminate 10. In this case, it is possible to block light of a wavelength longer than or equal to a wavelength of the absorption edge on the long wavelength side of the ultraviolet-visible absorption spectrum of the substrate and shorter than or equal to a wavelength of the absorption edge on the long wavelength side of the ultraviolet-visible absorption spectrum of the polymerization initiator, among the light emitting from the light source, and it is possible to irradiate the first layer 14A for forming a layer to be plated with only light having a wavelength of the shorter wavelength side than of the absorption edge on the long wavelength side of the ultraviolet-visible absorption spectrum of the substrate. As a result, the irradiated light can be absorbed by the substrate 14, and therefore the polymerization initiator in the second layer 14B for forming a layer to be plated can be suppressed from being exposed to light.

Further, by using the light-blocking filter, it is able to use various light sources. The aspect of the light-blocking filter is not particularly limited, and a known light-blocking filter may be used, examples of which include an absorption-type filter containing an absorbent (for example, a coloring agent or a pigment) capable of at least absorbing a specific wavelength; and a reflective type filter such as a bandpass filter (dielectric multilayer film).

EXAMPLES

Hereinafter, the present invention will be described in more detail with reference to the following Examples, but the present invention is not limited thereto.

Synthesis Example 1

Polymer 1

1 L of ethyl acetate and 159 g of 2-aminoethanol were charged into a 2 L three-neck flask which was then cooled in an ice bath. The internal temperature of the system was adjusted to 20° C. or lower, and 150 g of 2-bromoisobutyrate bromide was added dropwise thereto. Then, the internal temperature was elevated to room temperature (25° C.), followed by reaction for 2 hours. After the reaction was completed, 300 mL of distilled water was added to stop the reaction. Thereafter, the ethyl acetate phase was washed 4 times with 300 mL of distilled water and dried over magnesium sulfate, and ethyl acetate was further distilled off to obtain 80 g of a raw material A.

Next, 47.4 g of raw material A, 22 g of pyridine, and 150 mL of ethyl acetate were charged into a 500 mL three-neck flask which was then cooled in an ice bath. The internal temperature of the system was adjusted to 20° C. or lower, and 25 g of acrylic acid chloride was added dropwise thereto. Then, the temperature was elevated to room temperature, followed by reaction for 3 hours. After the reaction was completed, 300 mL of distilled water was added to stop the reaction. Thereafter, the ethyl acetate phase was washed 4 times with 300 mL of distilled water and dried over magnesium sulfate, and ethyl acetate was further distilled off. Then, column chromatography was carried out to obtain the following monomer M1 (20 g).

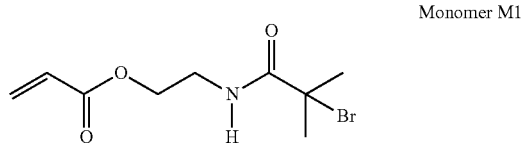

Monomer M1

8 g of N,N-dimethylacetamide was charged into a 500 mL three-neck flask which was then heated to 65° C. under a nitrogen stream. A solution of 14.3 g of monomer M1, 3.0 g of acrylonitrile (manufactured by Tokyo Chemical Industry Co., Ltd.), 6.5 g of acrylic acid (manufactured by Tokyo Chemical Industry Co., Ltd.), and 0.4 g of V-65 (manufactured by Wako Pure Chemical Industries, Ltd.) in 8 g of N,N-dimethylacetamide was added dropwise thereto over 4 hours.

After the dropwise addition was completed, the reaction solution was further stirred for three hours. Then, 41 g of N,N-dimethylacetamide was added, and the reaction solution was cooled to room temperature. 0.09 g of 4-hydroxy TEMPO (manufactured by Tokyo Chemical Industry Co., Ltd.), and 54.8 g of diazabicycloundecene (DBU) were added to the above reaction solution, followed by reaction at room temperature for 12 hours. Thereafter, 54 g of a 70 mass % aqueous methanesulfonic acid solution was added to the reaction solution. After the reaction was completed, re-precipitation was carried out with water and the solids were removed to obtain 12 g of polymer 1.

Identification of the resulting polymer 1 was carried out using an IR meter (manufactured by Horiba Ltd.). The measurement was carried out by dissolving a polymer in acetone and using KBr crystals. As a result of IR measurement, a peak was observed near 2240 $cm^{-1}$ and therefore it was found that acrylonitrile, which is a nitrile unit, has been introduced into the polymer. Further, it was found through an acid value measurement that acrylic acid has been introduced as a carboxylic acid group-containing unit. In addition, the polymer was dissolved in heavy dimethyl sulfoxide (DMSO), followed by measurement with a Bruker 300 MHz Nuclear Magnetic Resonance (NMR) Spectrometer (AV-300). A peak corresponding to the nitrile group-containing unit was broadly observed in 2.5-0.7 ppm (5H fraction), a peak corresponding to the polymerizable group-containing unit was broadly observed in 7.8-8.1 ppm (1H fraction), 5.8-5.6 ppm (1H fraction), 5.4-5.2 ppm (1H fraction), 4.2-3.9 ppm (2H fraction), 3.3-3.5 ppm (2H fraction), and 2.5-0.7 ppm (6H fraction), a peak corresponding to the carboxylic acid group-containing unit was broadly observed in 2.5-0.7 ppm (3H fraction), and the polymerizable group-containing unit:nitrile group-containing unit:carboxylic acid group-containing unit was found to be 30:30:40 (mol %).

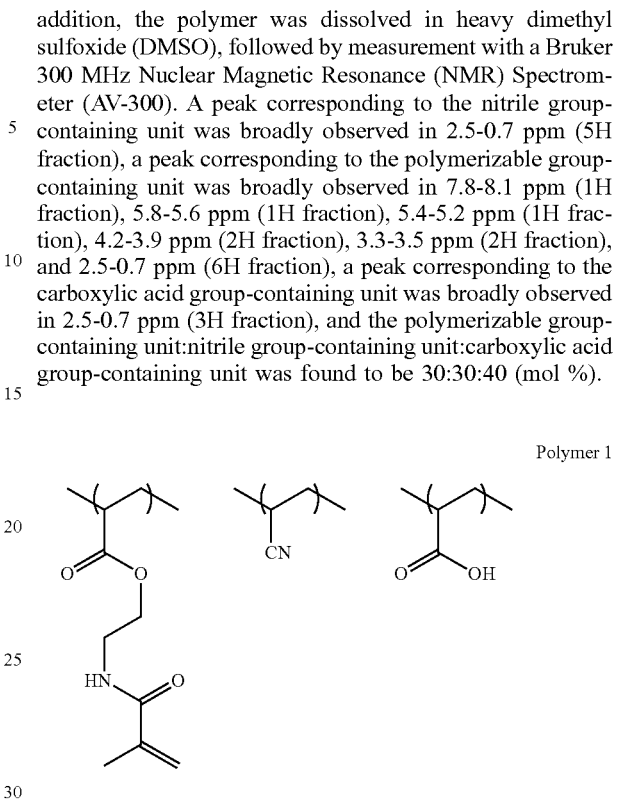

Polymer 1

<Preparation of Composition>

Isopropanol (IPA), Polymer 1, polyacrylic acid, methylenebisacrylamide (MBA), IRGACURE OXE02 (manufactured by BASF), IRGACURE 127 (manufactured by BASF), and IRGACURE 2959 (manufactured by BASF) were mixed in amounts according to Table 1 to obtain Compositions 1 to 4.

In Table 1, content of each component is expressed in terms of mass % relative to the total amount of the composition.

TABLE 1

| | Composition 1 | | Composition 2 | | Composition 3 | | Composition 4 | |
| --- | --- | --- | --- | --- | --- | --- | --- | --- |
| | Material | Amount | Material | Amount | Material | Amount | Material | Amount |
| Compound X or Composition Y | Polyacrylic acid | 3 | Polyacrylic acid | 3 | Polyacrylic acid | 3 | Polymer 1 | 5 |
| | MBA | 2 | MBA | 2 | MBA | 2 | — | — |
| Polymerization initiator | IRGACURE OXE02 | 0.1 | IRGACURE 127 | 0.1 | IRGACURE 2959 | 0.1 | IRGAGURE 127 | 0.1 |
| Solvent | IPA | 94.9 | IPA | 94.9 | IPA | 94.9 | IPA | 94.9 |

<Primer Layer-forming Composition>

A liquid of 100 g of hydrogenated nitrile butadiene rubber Zetpole 0020 (manufactured by Zeon Corporation) dissolved in 900 g of cyclopentanone (manufactured by Tokyo Chemical Industry Co., Ltd.) was served as a primer layer-forming composition.

<Preparation of Substrate>

[Preparation of Substrate S1-1]

ZF14 (ZEONOR film manufactured by Zeon Corporation) was dissolved in toluene, and a UV absorber LA-29 (manufactured by ADEKA Corporation) was added to 5 mass % in the resin component to prepare a substrate formed so as to have a film thickness of 100 μm which was then denoted by S1-1.

[Preparation of Substrate S1-2]

F5023 (ARTON film manufactured by JSR Corporation) was dissolved in toluene, and a UV absorber LA-29 (manufactured by ADEKA) was added to 5 mass % in the resin component to prepare a substrate formed so as to have a film thickness of 100 μm which was then denoted by S1-2.

[Preparation of Substrates S2-0 to 2-4]

A primer layer-forming composition was applied to a film thickness of 2 μm on each surface of A4300 having a thickness of 100 μm (PET film manufactured by Toyobo Co., Ltd.), ZF14 having a thickness of 100 μm, F5023 having a thickness of 100 μm, a substrate S1-1, and a substrate S1-2 by bar coating. The resulting substrates having primer layers formed on both surfaces thereof were respectively denoted by S2-0 to S2-4. More specifically, a substrate having primer layers disposed on both surfaces of A4300 having a thickness of 100 μm was denoted by S2-0, a substrate having primer layers disposed on both surfaces of ZF14 having a thickness of 100 μm was denoted by S2-1, a substrate having primer layers disposed on both surfaces of F5023 having a thickness of 100 μm was denoted by S2-2, a substrate having primer layers disposed on both surfaces of the substrate S1-1 was denoted by S2-3, and a substrate having primer layers disposed on both surfaces of the substrate S1-2 was denoted by S2-4.

<Preparation of Laminate>

[Laminates S3-1 to 10]

Substrates S2-0 to S2-4 and Compositions 1 to 4 were combined as shown in Table 2, and layers for forming a layer to be plated were formed so as to have a film thickness of 0.25 μm on both surfaces of each substrate by bar coating. The resulting structures were respectively denoted by laminates S3-1 to 10.

Comparative Examples 1 to 5 and Examples 1 to 6

The laminate S3-1 was sandwiched between two masks having a different pattern, and both surfaces of the laminate were respectively exposed in a predetermined patternwise fashion at an exposure energy of 100 mJ using a Deep UV Lamp (manufactured by Ushio) which is a UV lamp capable of emitting the outgoing light containing light having a wavelength of 300 nm or shorter. Then, the laminate was immersed and developed in a 1 mass % aqueous sodium carbonate solution at 40° C. for 5 minutes, thereby obtaining a sample containing a patterned layer to be plated. Further, the irradiation regions of the light to be irradiated on both surfaces of the laminate are different. That is, irradiation patterns (exposure patterns) to be irradiated on both surfaces of the laminate are different. Further, the outgoing light emitted from the foregoing UV lamp contains not only light having a wavelength of 300 nm or shorter, but also light having a wavelength of longer than 300 nm.

Samples were obtained in the same procedure as above, except that laminates S3-2 to S3-10 were used in place of the laminate S3-1.

Meanwhile, when carrying out exposure, only in Example 6, a bandpass filter that cuts light of 400 nm to 300 nm (manufactured by Asahi Spectra Co., Ltd.) was used between the light source and the mask. Further, the absorption edge on the long wavelength side of the ultraviolet-visible absorption spectrum of IRGACURE OXE02 which is a polymerization initiator used in Example 6 is positioned on the shorter wavelength side than 400 nm.

In addition, only in Comparative Example 5, a UV exposure machine (wavelength: 365 nm (cutting a short wavelength side using a soda glass) manufactured by San-Ei Electric Co., Ltd., model number: UVF-502S, lamp: UXM-501MD) was used as the light source.

<Evaluation of Double-sided Patternability>

Samples of Comparative Examples 1 to 5 and Examples 1 to 6 were immersed and dyed in 0.05 mass % of a rhodamine 6G aqueous solution for 5 minutes, and whether or not patterned layers to be plated disposed on both surfaces of a substrate have the same pattern shape as in the respective masks used was observed with an optical microscope. The case where the pattern of each patterned layer to be plated disposed on both surfaces of a substrate is the same desired pattern as the mask is expressed with "A", and the case where the pattern of any one patterned layer to be plated is not a desired pattern (the case where the patterned layer to be plated on the other surface is affected by light irradiation from one surface side) is expressed with "B". The results are summarized in Table 2.

In Table 2, the term "Absorption edge of initiator" refers to a position (nm) of the absorption edge on the long wavelength side of the ultraviolet-visible absorption spectrum of the polymerization initiator. The method of determining the absorption edge is as described above.

In the column "Absorption edge of initiator", the ">300" is intended to refer to that the position of the absorption edge of the polymerization initiator is greater than 300 nm and "<300" is intended to refer to that the position of the absorption edge of the polymerization initiator is less than 300 nm.

The term "Absorption edge of substrate" refers to a position (nm) of the absorption edge on the long wavelength side of the ultraviolet-visible absorption spectrum of the substrate. The method of determining the absorption edge is as described above.

In the column "Absorption edge of substrate", the "<250" is intended to refer to that the position of the absorption edge of the substrate is less than 250 nm.

In Table 2, in a case where the "Absorption edge of initiator" is "<300" and the "Absorption edge of substrate" is "<250" (Comparative Examples 3 and 4), the absorption edge of the initiator is positioned on the longer wavelength side than the absorption edge of the substrate.

TABLE 2

| | | Laminate | | | | | Absorption edge of initiator (nm) | Absorption edge of substrate (nm) | Evaluation of patternability |
|---|---|---|---|---|---|---|---|---|---|
| | No. of laminate | No. of substrate S2 | Material of substrate | Presence/absence of ultraviolet absorber | Type of composition | Bandpass filter | | | |
| Comparative Example 1 | S3-1 | S2-0 | A4300 | No | Composition 1 | No | >300 | 300 | B |
| Comparative Example 2 | S3-2 | S2-1 | ZF14 | No | Composition 1 | No | >300 | <250 | B |
| Comparative Example 3 | S3-3 | S2-1 | ZF14 | No | Composition 2 | No | <300 | <250 | B |

TABLE 2-continued

| | No. of laminate | No. of substrate S2 | Material of substrate | Presence/absence of ultraviolet absorber | Type of composition | Bandpass filter | Absorption edge of initiator (nm) | Absorption edge of substrate (nm) | Evaluation of patternability |
|---|---|---|---|---|---|---|---|---|---|
| Comparative Example 4 | S3-4 | S2-2 | F5023 | No | Composition 2 | No | <300 | <250 | B |
| Comparative Example 5 | S3-1 | S2-0 | A4300 | No | Composition 1 | No | >300 | 300 | B |
| Example 1 | S3-5 | S2-0 | A4300 | No | Composition 2 | No | <300 | 300 | A |
| Example 2 | S3-6 | S2-0 | A4300 | No | Composition 3 | No | <300 | 300 | A |
| Example 3 | S3-7 | S2-0 | A4300 | No | Composition 4 | No | <300 | 300 | A |
| Example 4 | S3-8 | S2-3 | S1-1 | Yes | Composition 2 | No | <300 | 300 | A |
| Example 5 | S3-9 | S2-4 | S1-2 | Yes | Composition 2 | No | <300 | 300 | A |
| Example 6 | S3-10 | S2-0 | A4300 | No | Composition 1 | Yes | >300 | 300 | A |

As shown in Table 2, according to the method for manufacturing a laminate containing patterned layers to be plated of the present invention, patterns of patterned layers to be plated disposed on both surfaces of a substrate could be prepared accurately and efficiently. Incidentally, Examples 1 to 5 satisfy the above-described requirement 1, and Example 6 satisfies the above-described requirement 2.

On the other hand, the desired effect was not obtained in Comparative Examples 1 to 5 that do not satisfy the requirements of the present invention. More specifically, in Comparative Examples 1 to 5, because a layer for forming a layer to be plated is irradiated with light being on the longer wavelength side than absorption edge on the long wavelength side of the ultraviolet-visible absorption spectrum of the substrate and having a wavelength to which a polymerization initiator is exposed, the light irradiated to a layer for forming a layer to be plated disposed on one surface of the substrate passed through the substrate and reached the layer for forming a layer to be plated disposed on the other surface of the substrate, and a polymerization initiator was exposed thereto, whereby a desired pattern was not formed.

Comparative Example 5 corresponds to the aspect with reference to JP2012-097296A.

<Confirmation of Drive as Touch Panel>

When forming samples of Examples 1 to 6, exposure to light was carried out using a mask having openings at the position of detection electrode portions (first detection electrode 26 and second detection electrode 30) and lead wire portions (first lead wire 28 and second lead wire 32) as shown in FIG. 6 as a mask, and therefore samples having a patterned layer to be plated were respectively obtained.

The obtained samples were subjected to electroless plating in the following manner, thereby forming a metal layer on the patterned layer to be plated. The resulting samples were immersed in a 5-fold dilution of only the MAT-2A of the Pd catalyst-applying liquid MAT-2 (manufactured by Uyemura & Co., Ltd.) at room temperature for 5 minutes, and washed twice with pure water. Then, the samples were immersed in a reducing agent MAB (manufactured by Uyemura & Co., Ltd.) at 36° C. for 5 minutes, and washed twice with pure water. Thereafter, the samples were respectively immersed in an electroless plating liquid THRU-CUP PEA (manufactured by Uyemura & Co., Ltd.) at room temperature for 60 minutes, and washed with pure water, thereby obtaining a metal layer-containing laminate having a wiring for a touch panel formed thereon. Incidentally, the resulting metal layer has been arranged so as to cover a surface other than the contact surface with the substrate of the patterned layer to be plated.

Each of the resulting metal layer-containing laminates was used to prepare a touch panel sensor to which various members were then attached. Then, when the resulting structures were driven as a touch panel, good operation properties were confirmed.

EXPLANATION OF REFERENCES

10: laminate
12, 120: substrate
14A: first layer for forming a layer to be plated
14B: second layer for forming a layer to be plated
16A, 16B, and 160: irradiation region
18A: first patterned layer to be plated
18B: second patterned layer to be plated
20: laminate containing patterned layers to be plated
22: metal layer
24, 124: metal layer-containing laminate
26: first detection electrode
28: first lead wire
30: second detection electrode
32: second lead wire
34: light-blocking filter
140A and 140B: resin composition layer

What is claimed is:

1. A method for manufacturing a laminate containing patterned layers to be plated, comprising:
    a step A of preparing a laminate having a substrate having two main surfaces, and layers for forming a layer to be plated, respectively disposed on two main surfaces of the substrate and containing a polymerization initiator and the following compound X or composition Y;
    a step B including a step B-1 of irradiating one layer for forming a layer to be plated with light in a patternwise fashion from one main surface side of the substrate in the laminate, so as to satisfy the following requirement 1 or requirement 2, and a step B-2 of irradiating the other layer for forming a layer to be plated with light in a patternwise fashion from the other main surface of the substrate, so as to satisfy the following requirement 1 or requirement 2; and
    a step C of removing non-light irradiated regions in the layers for forming a layer to be plated to form patterned layers to be plated on two main surfaces of the substrate, respectively,
    compound X: a compound having a functional group capable of interacting with a plating catalyst or a precursor thereof, and a polymerizable group,
    composition Y: a composition containing a compound having a functional group capable of interacting with a plating catalyst or a precursor thereof, and a compound having a polymerizable group, requirement 1: in a case where an absorption edge on the long wavelength side of an ultraviolet-visible absorption spectrum of the polymerization initiator is present in the shorter wavelength side than the absorption edge on the long wavelength side of the ultraviolet-visible absorption spectrum of the substrate, the layer for forming a layer to be plated is irradiated in a patternwise fashion with light of a wavelength to which the polymerization initiator is exposed, and requirement 2: in a case where the absorption edge on the long wavelength side of the ultraviolet-visible absorption spectrum of the polymerization initiator is present in the longer wavelength side than the absorption edge on the long wavelength side of the ultraviolet-visible visible absorption spectrum of the substrate, the layer for forming a layer to be plated is irradiated in a patternwise fashion with light of a wavelength to which a polymerization initiator is exposed, as light excluding light of a wavelength longer than or equal to a wavelength of the absorption edge on the long wavelength side of the ultraviolet-visible absorption spectrum of the substrate and shorter than or equal to a wavelength of the absorption edge on the long wavelength side of the ultraviolet-visible absorption spectrum of the polymerization initiator.

2. The method for manufacturing a laminate containing patterned layers to be plated according to claim 1, wherein, in the requirement 2, light irradiation is carried out using a light-blocking filter at least blocking the light having a wavelength longer than or equal to a wavelength of the absorption edge on the long wavelength side of the ultraviolet-visible absorption spectrum of the substrate and shorter than or equal to a wavelength of the absorption edge on the long wavelength side of the ultraviolet-visible absorption spectrum of the polymerization initiator.

3. The method for manufacturing a laminate containing patterned layers to be plated according to claim 1, wherein the substrate is a resin substrate.

4. The method for manufacturing a laminate containing patterned layers to be plated according to claim 1, wherein an ultraviolet absorber is included in the substrate.

5. The method for manufacturing a laminate containing patterned layers to be plated according to claim 1, wherein the substrate is a laminate having a support and an ultraviolet absorbing layer containing an ultraviolet absorber disposed on the support.

6. A method for manufacturing a metal layer-containing laminate, comprising a step of applying a plating catalyst or a precursor thereof onto the patterned layer to be plated in the laminate containing patterned layers to be plated obtained from the manufacturing method according to claim 1, carrying out a plating treatment on the patterned layer to be plated onto which the plating catalyst or the precursor thereof was applied, and then forming a metal layer on the patterned layer to be plated.

7. A touch panel sensor comprising a metal layer-containing laminate obtained from the manufacturing method according to claim 6.

8. A touch panel comprising a metal layer-containing laminate obtained from the manufacturing method according to claim 6.

9. The method for manufacturing a laminate containing patterned layers to be plated according to claim 2, wherein the substrate is a resin substrate.

10. The method for manufacturing a laminate containing patterned layers to be plated according to claim 2, wherein an ultraviolet absorber is included in the substrate.

11. The method for manufacturing a laminate containing patterned layers to be plated according to claim 3, wherein an ultraviolet absorber is included in the substrate.

12. The method for manufacturing a laminate containing patterned layers to be plated according to claim 2, wherein the substrate is a laminate having a support and an ultraviolet absorbing layer containing an ultraviolet absorber disposed on the support.

13. The method for manufacturing a laminate containing patterned layers to be plated according to claim 3, wherein the substrate is a laminate having a support and an ultraviolet absorbing layer containing an ultraviolet absorber disposed on the support.

14. The method for manufacturing a laminate containing patterned layers to be plated according to claim 4, wherein the substrate is a laminate having a support and an ultraviolet absorbing layer containing an ultraviolet absorber disposed on the support.

15. A method for manufacturing a metal layer-containing laminate, comprising a step of applying a plating catalyst or a precursor thereof onto the patterned layer to be plated in the laminate containing patterned layers to be plated obtained from the manufacturing method according to claim 2, carrying out a plating treatment on the patterned layer to be plated onto which the plating catalyst or the precursor thereof was applied, and then forming a metal layer on the patterned layer to be plated.

16. A method for manufacturing a metal layer-containing laminate, comprising a step of applying a plating catalyst or a precursor thereof onto the patterned layer to be plated in the laminate containing patterned layers to be plated obtained from the manufacturing method according to claim 3, carrying out a plating treatment on the patterned layer to be plated onto which the plating catalyst or the precursor thereof was applied, and then forming a metal layer on the patterned layer to be plated.

17. A method for manufacturing a metal layer-containing laminate, comprising a step of applying a plating catalyst or a precursor thereof onto the patterned layer to be plated in the laminate containing patterned layers to be plated obtained from the manufacturing method according to claim 4, carrying out a plating treatment on the patterned layer to be plated onto which the plating catalyst or the precursor thereof was applied, and then forming a metal layer on the patterned layer to be plated.

18. A method for manufacturing a metal layer-containing laminate, comprising a step of applying a plating catalyst or a precursor thereof onto the patterned layer to be plated in the laminate containing patterned layers to be plated obtained from the manufacturing method according to claim 5, carrying out a plating treatment on the patterned layer to be plated onto which the plating catalyst or the precursor thereof was applied, and then forming a metal layer on the patterned layer to be plated.

* * * * *